(12) United States Patent
Zhang et al.

(10) Patent No.: US 12,725,560 B1
(45) Date of Patent: Sep. 1, 2026

(54) RECONFIGURABLE LED DISPLAY SCREEN AND DISPLAY METHOD

(71) Applicant: Hangzhou Binary Optoelectronics & Tech Co., Ltd., Hangzhou (CN)

(72) Inventors: Gaole Zhang, Hangzhou (CN); Hao Shi, Hangzhou (CN)

(73) Assignee: Hangzhou Binary Optoelectronics & Tech Co., Ltd., Hangzhou (CN)

( * ) Notice: Subject to any disclaimer, the term of this patent is extended or adjusted under 35 U.S.C. 154(b) by 0 days.

(21) Appl. No.: 19/310,994

(22) Filed: Aug. 27, 2025

(30) Foreign Application Priority Data

May 27, 2025 (CN) ........................ 202510689457.6

(51) Int. Cl.
*G09G 3/32* (2016.01)
*G09G 3/20* (2006.01)
*H10H 29/85* (2025.01)

(52) U.S. Cl.
CPC ............. *G09G 3/2096* (2013.01); *G09G 3/32* (2013.01); *H10H 29/857* (2025.01); *G09G 2330/08* (2013.01)

(58) Field of Classification Search
CPC .... G09G 3/2096; G09G 3/32; G09G 2330/08; H10H 29/857
See application file for complete search history.

(56) References Cited

U.S. PATENT DOCUMENTS 9,506,633 B2 * 11/2016 Tischler .................. F21V 19/02
12,219,713 B1 * 2/2025 Shen ...................... H05K 1/181
2008/0049424 A1 * 2/2008 Wang ...................... F21V 23/06 362/391
2022/0052529 A1 * 2/2022 Zhang ..................... H02J 3/381
2022/0099257 A1 * 3/2022 Liu ....................... F21V 19/0025
2024/0014186 A1 * 1/2024 Zhang ..................... H05K 1/0289
2024/0163994 A1 * 5/2024 Guan ...................... H05B 45/40
2024/0231152 A1 * 7/2024 Du ........................ G02F 1/133615

FOREIGN PATENT DOCUMENTS

CN 212084565 U * 12/2020
CN 116631298 A * 8/2023 ........... H10H 20/857
CN 114866855 B * 1/2024 ........... H04N 21/643

OTHER PUBLICATIONS

CN 114866855, Jan. 19, 2024 (English Translation).*
CN 116631298; Aug. 22, 2023 (English Translation).*
CN 212084565, Dec. 4, 2020 (English Translation).*

* cited by examiner

*Primary Examiner* — Ricardo Osorio

(57) ABSTRACT

Provided are reconfigurable LED display screen and display method. The reconfigurable LED display screen includes at least one independent LED display unit; the LED display unit includes control terminal, main signal line and multiple expandable LED light strings, each LED light string includes repeater device arranged at head part and LED light-emitting elements sequentially connected in series with the repeater device, and two adjacent LED light-emitting elements in the LED light string are detachably connected in series, so as to change the LED light-emitting elements connected in series in the LED light string; the control terminal and the repeater devices in the plurality of LED light strings are sequentially connected in series to the main signal line, and two adjacent repeater devices on the main signal line are detachably connected in series, so as to change the repeater devices connected in series in the LED display unit.

14 Claims, 4 Drawing Sheets main signal line
branch signal line
C'$_4$
C'$_3$
C'$_{41}$
C'$_2$
C'$_{31}$
C'$_1$
C'$_{21}$
C'$_{42}$
K2
C'$_{32}$
C'$_{11}$
C'$_{22}$
auxiliary signal line
C'$_{12}$

RECONFIGURABLE LED DISPLAY SCREEN AND DISPLAY METHOD

CROSS-REFERENCE TO RELATED APPLICATIONS

The present disclosure claims the priority to the Chinese patent application with the filing No. 202510689457.6 filed with the Chinese Patent Office on May 27, 2025, the contents of which are incorporated herein by reference in entirety.

TECHNICAL FIELD

The present disclosure relates to the technical field of light-emitting diode (hereinafter LED) display screens, and in particular, to a reconfigurable LED display screen and a display method.

BACKGROUND

An LED light-emitting element is a common display device and is widely applied to various display screens, such as billboards, stage screens, and curtain walls. As shown in FIG. 1, in a conventional LED display screen, all LED light-emitting elements are connected in series in sequence. Therefore, the LED light-emitting elements are usually connected in series to transmit control signals for controlling the LED light-emitting elements. Each LED light-emitting element controls itself by receiving a control signal transmitted by a previous LED light-emitting element.

This connection method has obvious disadvantages. Specifically, since the LED light-emitting element is a power component, this component is easy to be damaged after long-term operation. If any one of LED light-emitting elements connected in series is damaged (for example, D4 in FIG. 1 is damaged), the subsequent LED light-emitting elements (D5-D10 in FIG. 1) cannot receive a control signal and lose control.

Meanwhile, the size, dimensions and shape of current LED display screens are usually set before delivered from a factory, which cannot be flexibly adjusted, and have poor reusability.

SUMMARY

In view of this, the present disclosure provides a reconfigurable LED display screen and a display method, so as to improve the reliability, flexibility, and reusability of the reconfigurable LED display screen.

According to a first aspect, an embodiment of the present disclosure provides a reconfigurable LED display screen, where the reconfigurable LED display screen includes at least one independent LED display unit; the LED display unit includes a control terminal, a main signal line and a plurality of expandable LED light strings, each LED light string includes a repeater device arranged at a head part and LED light-emitting elements sequentially connected in series with the repeater device, and two adjacent LED light-emitting elements in the LED light string are detachably connected in series, so as to change the LED light-emitting elements connected in series in the LED light string; the control terminal and the repeater devices in the plurality of LED light strings are sequentially connected in series to the main signal line, and two adjacent repeater devices on the main signal line are detachably connected in series, so as to change the repeater devices connected in series to the main signal line;

- the control terminal is configured to: transmit a control signal sequence currently configured for an LED display unit where the control terminal is located to a repeater device connected in series with the control terminal; the control signal sequence includes control signals of LED light-emitting elements in the LED display unit where the control terminal is located, and an arrangement order of the control signals is determined based on an arrangement order of the repeater devices in the LED display unit and an arrangement order of the LED light-emitting elements in the LED light string;
- the repeater device is configured to: after receiving the control signal sequence, retain first first-LED-count control signals (i.e., first control signals in a number of first-LED-count) according to first-LED-count configured currently, control an LED light string where the repeater device is located by using the retained control signals, and forward remaining control signal sequences to a next repeater device; and the first-LED-count configured in the repeater device is a number of LED light-emitting elements connected in series in the LED light string where the repeater device is located.

With reference to the first aspect, an embodiment of the present disclosure provides a first possible implementation of the first aspect, where a first expansion input interface and a first expansion output interface are arranged on each LED light-emitting element;

- two adjacent LED light-emitting elements in the LED light string are electrically connected or separated through a first expansion input interface on one LED light-emitting element and a first expansion output interface on the other LED light-emitting element, so as to change the LED light-emitting elements connected in series in the LED light string; and
- a first expansion output interface is retained on an LED light-emitting element at a tail part of the LED light string, and the first expansion output interface is configured to expand and connect first expansion input interfaces of other LED light-emitting elements in series at the tail part of the LED light string.

With reference to the first aspect, an embodiment of the present disclosure provides a second possible implementation of the first aspect, where the LED display unit further includes a plurality of branch signal lines, and each repeater device on the main signal line is detachably connected to different branch signal lines; repeater devices in some LED light strings in the LED display screen are connected in series to the main signal line, and for remaining LED light strings, a repeater device in at least one of the remaining LED light strings is connected in series to each branch signal line; and two adjacent repeater devices on the branch signal line are detachably connected in series, so as to change the repeater devices connected in series to the branch signal line.

With reference to the second possible implementation of the first aspect, an embodiment of the present disclosure provides a third possible implementation of the first aspect, where a second expansion input interface and a second expansion output interface are arranged on each repeater device;

- two adjacent repeater devices on the main signal line and/or the branch signal line are electrically connected or separated through a second expansion input interface on one repeater device and a second expansion output interface on the other repeater device, so as to change the repeater devices connected in series to the main signal line and/or the branch signal line; and a second expansion output interface is retained on a repeater device located at a tail part on the main signal line and/or the branch signal line, and the second expansion output interface is configured to expand and connect second expansion input interfaces of other repeater devices in series on the repeater device located at the tail part on the main signal line and/or the branch signal line.

With reference to the first aspect, an embodiment of the present disclosure provides a fourth possible implementation of the first aspect, where the control signal is a color control signal, and the color control signal is a signal with a first bit number; the control signal sequence is transmitted through a return-to-zero code protocol, and a signal transmission rate of the return-to-zero code protocol is a first rate;

a number of the LED light-emitting elements connected in series in each LED light string is not more than a first number, so that a refresh rate of the reconfigurable LED display screen reaches a target frame number refreshed by an image per second; and the first number is a ratio of a first data amount to be transmitted per frame to the first bit number, and the first data amount is a ratio of the first rate to the target frame number.

With reference to the first aspect, an embodiment of the present disclosure provides a fifth possible implementation of the first aspect, where a read-write memory is arranged in the repeater device, and the first-LED-count configured in the repeater device is written into the read-write memory;

the repeater device, when configured to retain the first first-LED-count control signals according to the first-LED-count configured currently, is specifically configured to:

read the written first-LED-count from the read-write memory, and retain the first first-LED-count control signals in the received control signal sequence according to the read first-LED-count.

With reference to the fifth possible implementation of the first aspect, an embodiment of the present disclosure provides a sixth possible implementation of the first aspect, where before use, the reconfigurable LED display screen is subjected to initialization configuration on first-LED-count of individual repeater devices in the reconfigurable LED display screen by the following manners:

for each repeater device in the reconfigurable LED display screen, receiving, from the control terminal in the LED display unit where the repeater device is located, a first repeater configuration parameter initialized and configured for the repeater device through a serial port protocol, where the first repeater configuration parameter includes an initialized first-LED-count; and writing the first-LED-count included in the first repeater configuration parameter into a read-write memory of the repeater device, so as to perform initialization repeater parameter configuration on the repeater device.

With reference to the fifth possible implementation of the first aspect, an embodiment of the present disclosure provides a seventh possible implementation of the first aspect, where in a use process of the reconfigurable LED display screen, for any one of LED display units in the reconfigurable LED display screen, if there is a change in LED light-emitting elements connected in series in at least one LED light string in the LED display unit, first-LED-count in individual repeater devices in the LED display unit is configured online by the following manners:

for each repeater device in the LED display unit, receiving, from the control terminal in the LED display unit, a first repeater configuration parameter reconfigured for the repeater device through a serial port protocol, where the reconfigured first repeater configuration parameter includes first-LED-count reconfigured for the repeater device online; the first-LED-count reconfigured for the repeater device online is equal to a number of LED light-emitting elements connected in series currently in an LED light string where the repeater device is located; and writing the first-LED-count included in the first repeater configuration parameter into a read-write memory of the repeater device, and replacing the first-LED-count stored in the read-write memory with the first-LED-count reconfigured online, so as to update the first-LED-count in the repeater device online.

With reference to the sixth possible implementation or the seventh possible implementation of the first aspect, an embodiment of the present disclosure provides an eighth possible implementation of the first aspect, where the first repeater configuration parameter includes, in a sequential order: a first start delimiter, a first command code, a first-LED-count, a first check code and a first end delimiter; the first check code is obtained by performing an XOR operation on one or more pieces of data in the first start delimiter, the first command code, the first-LED-count and the first end delimiter by the control terminal;

the writing the first-LED-count included in the first repeater configuration parameter into a read-write memory of the repeater device includes:

after receiving a first repeater configuration parameter for the repeater device sent by the control terminal, performing an XOR operation on one or more pieces of data in a first start delimiter, a first command code, a first-LED-count and a first end delimiter included in the received first repeater configuration parameter to obtain a first XOR value;

determining whether the first XOR value is consistent with the first check code, and if the first XOR value is consistent with the first check code, writing the first-LED-count included in the first repeater configuration parameter into the read-write memory of the repeater device; and if the first XOR value is inconsistent with the first check code, stopping writing the first-LED-count included in the first repeater configuration parameter into the read-write memory of the repeater device.

With reference to the first aspect, an embodiment of the present disclosure provides a ninth possible implementation of the first aspect, where if repeater devices in a plurality of LED light strings included in the LED display unit are all connected in series to the main signal line, repeater devices at two ends of the repeater devices connected in series to the main signal line are respectively used as a head-end repeater device and a tail-end repeater device; the head-end repeater device is connected in series with the control terminal;

the repeater device, when configured to, after receiving the control signal sequence, retain first first-LED-count control signals according to first-LED-count configured currently, control an LED light string where the repeater device is located by using the retained control signals, and forward remaining control signal sequences to a next repeater device, is specifically configured to:

when the repeater device is a head-end repeater device, receive a control signal sequence from the control terminal in the LED display unit where the repeater device is located, retain first first-LED-count control signals in the control signal sequence according to first-LED-count configured for the repeater device, control an LED light string where the head-end repeater device is located by using the retained control signals, and forward remaining control signal sequences to a next repeater device of the head-end repeater device; and when the repeater device is a non-head-end repeater device, receive a control signal sequence transmitted from a previous repeater device of the non-head-end repeater device, retain first first-LED-count control signals in the control signal sequence according to first-LED-count configured for the repeater device, control an LED light string where the non-head-end repeater device is located by using the retained control signals, transmit remaining control signal sequences to a next repeater device of the non-head-end repeater device if the non-head-end repeater device is not a tail-end repeater device, or complete transmission of the control signal sequence in the LED display unit where the repeater device is located if the non-head-end repeater device is a tail-end repeater device.

With reference to the second possible implementation of the first aspect, an embodiment of the present disclosure provides a tenth possible implementation of the first aspect, where repeater devices at two ends of repeater devices connected in series to the branch signal line are respectively used as a branch head-end repeater device and a branch tail-end repeater device, and the branch head-end repeater device is connected to the repeater device on the main signal line; according to the control signal sequence configured for the LED display unit where the control terminal is located in the control terminal, an arrangement order of control signals is determined based on an arrangement order of the repeater devices on the main signal line, an arrangement order of the repeater devices on the branch signal line, and an arrangement order of the LED light-emitting element in the LED light string;

the repeater device, when configured to, after receiving the control signal sequence, retain first first-LED-count control signals according to first-LED-count configured currently, control an LED light string where the repeater device is located by using the retained control signals, and forward remaining control signal sequences to a next repeater device, is specifically configured to:

when the repeater device is a repeater device on the main signal line, after receiving the control signal sequence, retain first second-LED-count control signals according to second-LED-count configured for the repeater device, transmit remaining control signal sequences to a next repeater device of the repeater device on the main signal line through the main signal line, retain first first-LED-count control signals according to first-LED-count configured for the repeater device, control an LED light string where the repeater device is located by using the retained control signals, and transmit remaining control signal sequences to a branch head-end repeater device on the branch signal line through the branch signal line, where the second-LED-count configured in the repeater device on the main signal line is a sum of the first-LED-count and a total number of LED light-emitting elements connected in series in LED light strings on a branch signal line connected to the repeater device; and when the repeater device is a repeater device on the branch signal line, after receiving the control signal sequence, retain first first-LED-count control signals, control the LED light string where the repeater device is located by using the retained control signals, and forward remaining control signal sequences to a next repeater device on the branch signal line through the branch signal line.

With reference to the tenth possible implementation of the first aspect, an embodiment of the present disclosure provides an eleventh possible implementation of the first aspect, where repeater devices at two ends of repeater devices connected in series to the main signal line are respectively used as a main line head-end repeater device and a main line tail-end repeater device, and the main line head-end repeater device is connected in series with the control terminal;

the repeater device on the main signal line, when configured to, after receiving the control signal sequence, retain first second-LED-count control signals according to second-LED-count configured for the repeater device, transmit remaining control signal sequences to a next repeater device of the repeater device on the main signal line through the main signal line, retain first first-LED-count control signals according to first-LED-count configured for the repeater device, control an LED light string where the repeater device is located by using the retained control signals, and transmit remaining control signal sequences to a branch head-end repeater device on the branch signal line through the branch signal line, is specifically configured to:

when the repeater device is a main line head-end repeater device, receive a control signal sequence from the control terminal in an LED display unit where the repeater device is located, retain first second-LED-count control signals in the control signal sequence according to the second-LED-count configured for the repeater device, transmit remaining control signal sequences to a next repeater device of the repeater device on the main signal line through the main signal line, retain first first-LED-count control signals from the second-LED-count control signals retained for the repeater device according to the first-LED-count configured for the repeater device, control an LED light string where the repeater device is located by using the retained control signals, transmit remaining control signal sequences in the second-LED-count control signals retained for the repeater device to a branch head-end repeater device on the branch signal line through the branch signal line connected with the repeater device;

when the repeater device is a main line non-head-end repeater device, receive a control signal sequence transmitted from a previous repeater device of the main line non-head-end repeater device on the main signal line, retain first second-LED-count control signals in the control signal sequence according to the second-LED-count configured for the repeater device, transmit remaining control signal sequences to a next repeater device of the main line non-head-end repeater device on the main signal line if the main line non-head-end repeater device is not a main line tail-end repeater device; or complete transmission of the control signal sequence on the main signal line where the repeater device is located if the main line non-head-end repeater device is a main line tail-end repeater device, retain first first-LED-count control signals from second-LED-count control signals retained for the repeater device according to the first-LED-count configured for the repeater device, control an LED light string where the repeater device is located by using the retained control signals, and transmit remaining control signal sequences in the second-LED-count control signals retained for the repeater device to a branch head-end repeater device on the branch signal line through the branch signal line connected with the repeater device.

With reference to the third possible implementation of the first aspect, an embodiment of the present disclosure provides a twelfth possible implementation of the first aspect, where LED light-emitting elements at two ends in the LED light string are respectively a head-end LED light-emitting element and a tail-end LED light-emitting element, and the head-end LED light-emitting element is connected to the repeater device;

the repeater device, when configured to control an LED light string where the repeater device is located by using the retained control signals, is specifically configured to:

transmit retained first-LED-count control signals to the head-end LED light-emitting element connected with the repeater device based on the return-to-zero code protocol; and the LED light-emitting element is configured to: when the LED light-emitting element works normally, retain a control signal for controlling the LED light-emitting element, control the LED light-emitting element by the retained control signal, and transmit remaining control signals to a next LED light-emitting element.

According to a second aspect, an embodiment of the present disclosure further provides a display method, where the method is applied to a reconfigurable LED display screen, where the reconfigurable LED display screen includes at least one independent LED display unit; the LED display unit includes a control terminal, a main signal line and a plurality of expandable LED light strings, each LED light string includes a repeater device arranged at a head part and LED light-emitting elements sequentially connected in series with the repeater device, and two adjacent LED light-emitting elements in the LED light string are detachably connected in series, so as to change the LED light-emitting elements connected in series in the LED light string; the control terminal and the repeater devices in the plurality of LED light strings are sequentially connected in series to the main signal line, and two adjacent repeater devices on the main signal line are detachably connected in series, so as to change the repeater devices connected in series to the main signal line; the method includes:

transmitting, by the control terminal, a control signal sequence currently configured for an LED display unit where the control terminal is located to a repeater device connected in series with the control terminal, where the control signal sequence includes control signals of LED light-emitting elements in the LED display unit where the control terminal is located, and an arrangement order of the control signals is determined based on an arrangement order of the repeater devices in the LED display unit and an arrangement order of the LED light-emitting elements in the LED light string;

after the repeater device receives the control signal sequence, retaining first first-LED-count control signals according to first-LED-count configured currently, controlling an LED light string where the repeater device is located by using the retained control signals, and forwarding remaining control signal sequences to a next repeater device, where the first-LED-count configured in the repeater device is a number of LED light-emitting elements connected in series in the LED light string where the repeater device is located.

According to the reconfigurable LED display screen and the display method provided in embodiments of the present disclosure, each LED display unit includes a control terminal, a main signal line, and a plurality of expandable LED light strings, each LED light string includes a repeater device arranged at a head part and LED light-emitting elements sequentially connected in series with the repeater device, and the control terminal and the repeater devices in the plurality of LED light strings are sequentially connected in series to the main signal line. Therefore, when one of the LED light-emitting elements is damaged, only the transmission of the control signal in the LED light string where the LED light-emitting element is located is affected, other LED light strings in a parallel link are not affected, and the normal operation of the other LED light strings in the parallel link may be ensured. In other words, the added repeater device, even when one of the LED light-emitting elements fails, still bypasses an LED light string where this failure point is located, and continue to transmit the control signal sequence forward to ensure that LED light-emitting elements in remaining LED light strings may still work normally.

Meanwhile, two adjacent LED light-emitting elements in the LED light string are detachably connected in series, so as to change the LED light-emitting elements connected in series in the LED light string; two adjacent repeater devices on the main signal line are detachably connected in series, so as to change the repeater devices connected in series to the main signal line. Therefore, the length of each LED light string and the number of the LED light strings may be dynamically adjusted based on a use requirement, and the size, dimensions and shape of the LED display unit may be further dynamically adjusted. Meanwhile, the number and the arrangement positions of the LED display units in the reconfigurable LED display screen may be dynamically adjusted based on a use requirement, and the size, dimensions and shape of the reconfigurable LED display screen may be further changed. In addition, the reusability of repeater devices and LED light-emitting elements may be achieved.

To make the above objectives, features and advantages of the present disclosure comprehensible, preferred embodiments with reference to the accompanying drawings are described in detail below.

BRIEF DESCRIPTION OF DRAWINGS

To more clearly illustrate the technical solutions of the embodiments of the present disclosure, the accompanying drawings required in the embodiments will be briefly described below. It should be understood that the following drawings only illustrate some embodiments of the present disclosure and therefore should not be considered as limitations of the scope, and for those of ordinary skill in the art, other related drawings can be obtained according to these drawings without creative efforts.

DETAILED DESCRIPTION OF EMBODIMENTS

Figure 1:
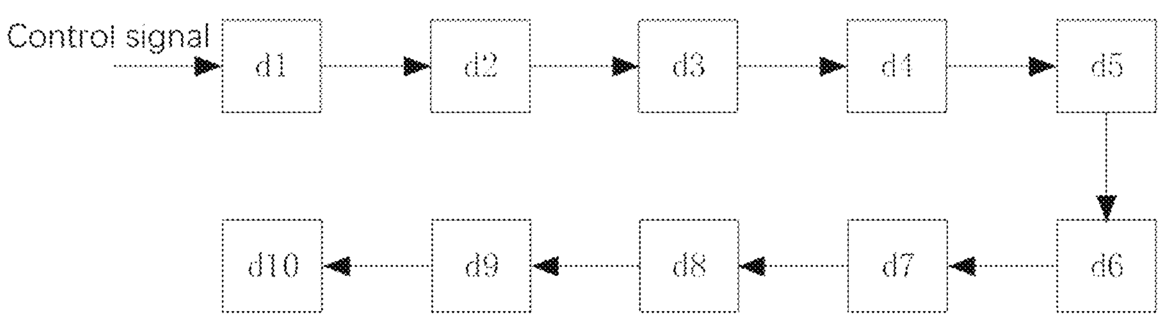
FIG. 1 is a schematic diagram of a connection relationship of LED light-emitting elements in an existing LED display screen according to an embodiment of the present disclosure.

To make the objectives, technical solutions, and advantages of embodiments of the present disclosure clearer, the following clearly and completely describes the technical solutions in embodiments of the present disclosure with reference to the accompanying drawings in embodiments of the present disclosure. It is clear that the described embodiments are merely some rather than all of embodiments of the present disclosure. The assemblies of embodiments of the present disclosure, as generally described and illustrated in the figures herein, can be arranged and designed in a wide variety of different configurations. Therefore, the following detailed descriptions of the embodiments of the present disclosure provided in the accompanying drawings are not intended to limit the scope of the claimed application, but merely to represent selected embodiments of the present disclosure. All other embodiments obtained by a person skilled in the art based on the embodiments of the present disclosure without creative efforts shall fall within the protection scope of the present disclosure.

In the existing LED display screen, once a certain LED light-emitting element fails, the entire signal link may be interrupted; consequently, all LED light-emitting elements after this failure point cannot receive power or control signals and are turned off. Meanwhile, the size, dimensions and shape of LED display screens are usually set before delivered from a factory, which cannot be flexibly adjusted, and have poor reusability. Based on this, embodiments of the present disclosure provide a reconfigurable LED display screen and a display method, which are described below with embodiments.

To facilitate understanding of the embodiments, a reconfigurable LED display screen disclosed in an embodiment of the present disclosure is first introduced in detail. The reconfigurable LED display screen includes at least one independent LED display unit; the LED display unit includes a control terminal, a main signal line and a plurality of expandable LED light strings, each LED light string includes a repeater device arranged at a head part and LED light-emitting elements sequentially connected in series with the repeater device, and two adjacent LED light-emitting elements in the LED light string are detachably connected in series, so as to change the LED light-emitting elements connected in series in the LED light string; the control terminal and the repeater devices in the plurality of LED light strings are sequentially connected in series to the main signal line, and two adjacent repeater devices on the main signal line are detachably connected in series, so as to change the repeater devices connected in series to the main signal line;

- the control terminal is configured to: transmit a control signal sequence currently configured for an LED display unit where the control terminal is located to a repeater device connected in series with the control terminal; the control signal sequence includes control signals of LED light-emitting elements in the LED display unit where the control terminal is located, and an arrangement order of the control signals is determined based on an arrangement order of the repeater devices in the LED display unit and an arrangement order of the LED light-emitting elements in the LED light string;
- the repeater device is configured to: after receiving the control signal sequence, retain first first-LED-count control signals according to first-LED-count configured currently, control an LED light string where the repeater device is located by using the retained control signals, and forward remaining control signal sequences to a next repeater device; and the first-LED-count configured in the repeater device is a number of LED light-emitting elements connected in series in the LED light string where the repeater device is located.

In this embodiment, each LED display unit includes a control terminal, a main signal line, and a plurality of expandable LED light strings, and each expandable LED light string includes a repeater device arranged at a head part and at least one LED light-emitting element connected in series with the repeater device. The control terminal in the LED display unit is connected to one end of the main signal line, and repeater devices arranged at the head parts in the plurality of LED light strings are sequentially connected in series to the main signal line.

Figure 2:
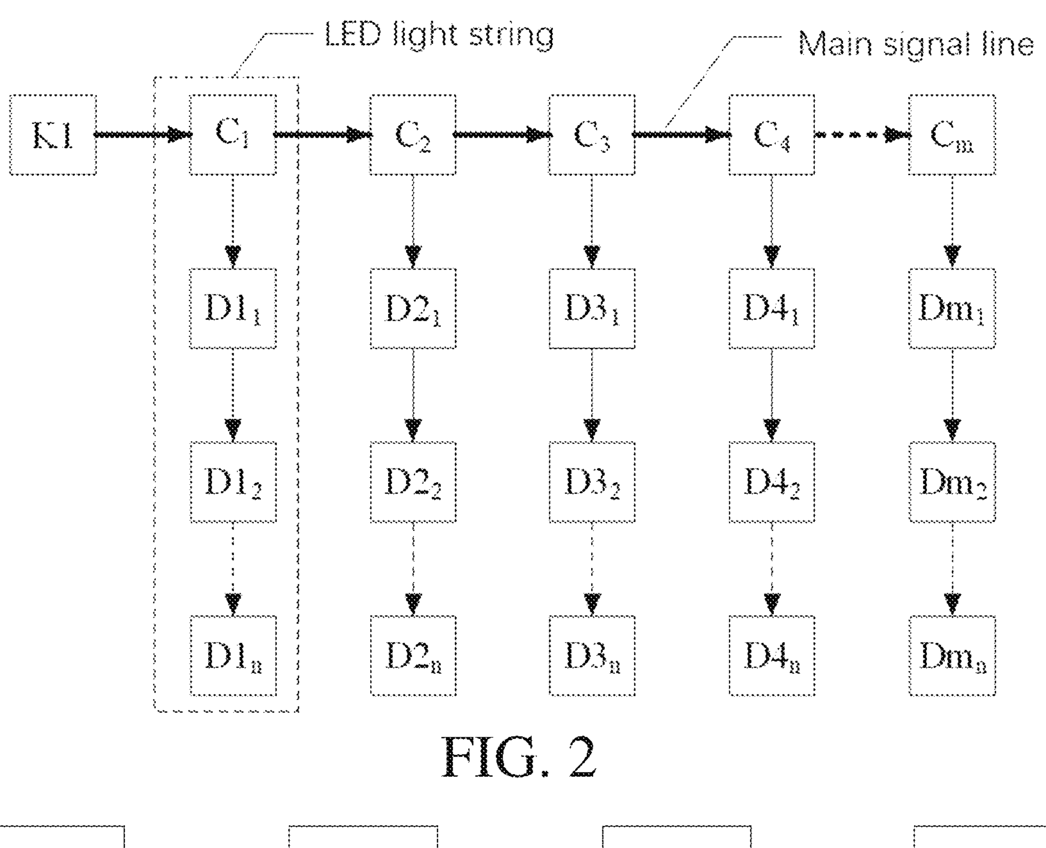
FIG. 2 is a schematic diagram of a circuit connection relationship between a control terminal, a main signal line, and a plurality of expandable LED light strings in an LED display unit according to an embodiment of the present disclosure.

For example, the LED display unit shown in FIG. 2 includes a control terminal K1 and m LED light strings, and each LED light string includes a repeater device arranged at a head part and n LED light-emitting elements sequentially connected in series with the repeater device.

In FIG. 2, $C_1$, $C_2$, $C_3$, $C_4$ . . . $C_m$ are repeater devices in different LED light strings.

$D1_1$, $D1_2$ . . . $D1_n$ are n LED light-emitting elements sequentially connected in series with the repeater device $C_1$;

$D2_1$, $D2_2$ . . . $D2_n$ are n LED light-emitting elements sequentially connected in series with the repeater device $C_2$;

$D3_1$, $D3_2$ . . . $D3_n$ are n LED light-emitting elements sequentially connected in series with the repeater device $C_3$;

$D4_1$, $D4_2$ . . . $D4_n$ are n LED light-emitting elements sequentially connected in series with the repeater device $C_4$;

$Dm_1$, $Dm_2$ . . . $Dm_n$ are n LED light-emitting elements sequentially connected in series with the repeater device $C_m$.

In this embodiment, the number of LED light strings included in different LED display units may be the same or different; and the number of the LED light-emitting elements connected in series in different LED light strings may be the same or different.

In this embodiment, two adjacent LED light-emitting elements in the LED light string are detachably connected in series, so as to dynamically change the number of the LED light-emitting elements connected in series in the LED light string, and/or dynamically replace a damaged LED light-emitting element in the LED light-emitting elements connected in series in the LED light string. Two adjacent repeater devices on the main signal line are detachably connected in series, so as to dynamically change the number of the repeater devices connected in series to the main signal line and/or dynamically replace a damaged repeater device in the repeater devices connected in series to the main signal line.

In this embodiment, for each LED display unit, a control terminal in the LED display unit is configured with a control signal corresponding to each LED light-emitting element in the LED display unit, where the control signal is configured to control light emission of the LED light-emitting element, and the control signal corresponding to each LED light-emitting element is configured to control light emission of the LED display unit, so that a corresponding image is displayed in the LED display unit.

In this embodiment, the control signal corresponding to each LED light-emitting element is determined according to an arrangement order of repeater devices in the LED display unit and an arrangement order of LED light-emitting elements in the LED light string.

In a possible implementation, if repeater devices in a plurality of LED light strings included in the LED display unit are all connected in series to the main signal line, repeater devices at two ends of the repeater devices connected in series to the main signal line are respectively used as a head-end repeater device and a tail-end repeater device; and the head-end repeater device is connected in series with the control terminal. For example, as shown in FIG. 2, the head-end repeater device is $C_1$, and the tail-end repeater device is $C_m$.

In this case, in the same LED display unit, the repeater devices are arranged in the LED display unit in the order from the head-end repeater device to the tail-end repeater device. That is, the head-end repeater device is arranged at the front and the tail-end repeater device is arranged at the back. In the same LED light string, two ends of the LED light-emitting elements connected in series are respectively a head-end LED light-emitting element and a tail-end LED light-emitting element, and the repeater device in the LED light string is connected to the head-end LED light-emitting element. The arrangement order of the LED light-emitting elements in the LED light string is arranged from the head-end LED light-emitting element to the tail-end LED light-emitting element. That is, the head-end LED light-emitting element is arranged at the front, and the tail-end LED light-emitting element is arranged at the back.

As shown in FIG. 2, assuming that m=5, n=3 the LED display unit includes 5 repeater devices ($C_1$, $C_2$, $C_3$, $C_4$, and $C_5$), and 15 LED light-emitting elements ($D1_1$-$D5_3$). The arrangement order of control signals of the LED light-emitting elements in the LED display unit from front to back is: $X(D1_1)$, $X(D1_2)$, $X(D1_3)$, $X(D2_1)$, $X(D2_2)$, $X(D2_3)$, $X(D3_1)$, $X(D3_2)$, $X(D3_3)$, $X(D4_1)$, $X(D4_2)$, $X(D4_3)$, $X(D5_1)$, $X(D5_2)$, and $X(D5_3)$. Therefore, the control signal sequence of the LED display unit is: $\{X(D1_1); X(D1_2); X(D1_3); X(D2_1); X(D2_2); X(D2_3); X(D3_1); X(D3_2); X(D3_3); X(D4_1); X(D4_2); X(D4_3); X(D5_1); X(D5_2); X(D5_3)\}$. Taking the control signal $X(D1_1)$ as an example, $X(D1_1)$ refers to a control signal of the LED light-emitting element $D1_1$, and other control signals are not described again.

In this example, since an LED light string where each repeater device ($C_1$, $C_2$, $C_3$, $C_4$, or $C_5$) is located includes three LED light-emitting elements connected in series, first-LED-count currently configured for each repeater device is 3.

In this embodiment, in the actual working process of the reconfigurable LED display screen, for each LED display unit in the reconfigurable LED display screen, a control terminal in the LED display unit transmits a control signal sequence of the LED display unit to a head-end repeater device in the LED display unit.

In this case, the repeater device on the main signal line, when configured to, after receiving the control signal sequence, retain first first-LED-count control signals according to first-LED-count configured currently, control an LED light string where the repeater device is located by using the retained control signals, and forward remaining control signal sequences to a next repeater device, is specifically configured to:

when the repeater device is a head-end repeater device, receive a control signal sequence from the control terminal in the LED display unit where the repeater device is located, retain first first-LED-count control signals in the control signal sequence according to first-LED-count configured for the repeater device, control an LED light string where the head-end repeater device is located by using the retained control signals, and forward remaining control signal sequences to a next repeater device of the head-end repeater device; and when the repeater device is a non-head-end repeater device, receive a control signal sequence transmitted from a previous repeater device of the non-head-end repeater device, retain first first-LED-count control signals in the control signal sequence according to first-LED-count configured for the repeater device, control an LED light string where the non-head-end repeater device is located by using the retained control signals, transmit remaining control signal sequences to a next repeater device of the non-head-end repeater device if the non-head-end repeater device is not a tail-end repeater device, or complete transmission of the control signal sequence in the LED display unit where the repeater device is located if the non-head-end repeater device is a tail-end repeater device.

In this embodiment, after receiving the control signal sequence sent by the control terminal, the first-end repeater device retains first first-LED-count control signals according to the first-LED-count currently configured for the first-end repeater device, and controls an LED light string where the first-end repeater device is located by using the retained control signals. If there are remaining control signal sequences, the first-end repeater device forwards the remaining control signal sequence to a next repeater device.

A middle repeater device (i.e., a repeater device at a non-head end and a non-tail end in the LED display unit) is configured to: after receiving the control signal sequence transmitted by the previous repeater device, retain first first-LED-count control signals according to first-LED-count currently configured for the middle repeater device, and control the LED light string where the first-end repeater device is located by using the retained control signals. If there are remaining control signal sequences, the middle repeater device forwards the remaining control signal sequence to a next repeater device.

The tail-end repeater device is configured to: after receiving the control signal sequence transmitted by the previous repeater device, retain first first-LED-count control signals according to first-LED-count currently configured for the tail-end repeater device, and control the LED light string where the first-end repeater device is located by using the retained control signals.

In this embodiment, the next repeater device of the repeater device refers to: among the repeater devices connected in series with the repeater device on the main signal line, an adjacent repeater device located after (downstream of) the repeater device in the order from the head-end repeater device to the tail-end repeater device. The previous repeater device of the repeater device refers to: among the repeater devices connected in series with the repeater device on the main signal line, an adjacent repeater device located before (upstream of) the repeater device in the order from the head-end repeater device to the tail-end repeater device.

For example, as shown in FIG. 2, following the foregoing example, assuming that m=5 and n=3, the control terminal K1 of the LED display unit transmits the control signal sequence of the LED display unit {$X(D\mathbf{1}_1)$; $X(D\mathbf{1}_2)$; $X(D_3)$; $X(D\mathbf{2}_1)$; $X(D\mathbf{2}_2)$; $X(D\mathbf{2}_3)$; $X(D\mathbf{3}_1)$; $X(D\mathbf{3}_2)$; $X(D\mathbf{3}_3)$; $X(D\mathbf{4}_1)$; $X(D\mathbf{4}_2)$; $X(D\mathbf{4}_3)$; $X(D\mathbf{5}_1)$; $X(D\mathbf{5}_2)$; $X(D\mathbf{5}_3)$} to the head-end repeater device $C_1$.

After receiving the control signal sequence sent by the control terminal K1, the head-end repeater device $C_1$ retains first 3 control signals {$X(D\mathbf{1}_1)$; $X(D\mathbf{1}_2)$; $X(D\mathbf{1}_3)$} according to first-LED-count 3 currently configured for the head-end repeater device; and the 3 control signals are configured to control the LED light string ($D\mathbf{1}_1$, $D\mathbf{1}_2$, $D\mathbf{1}_3$) where the repeater device $C_1$ is located. The head-end repeater device transmits remaining control signal sequences {$X(D\mathbf{2}_1)$; $X(D\mathbf{2}_2)$; $X(D\mathbf{2}_3)$; $X(D\mathbf{3}_1)$; $X(D\mathbf{3}_2)$; $X(D\mathbf{3}_3)$; $X(D\mathbf{4}_1)$; $X(D\mathbf{4}_2)$; $X(D\mathbf{4}_3)$; $X(D\mathbf{5}_1)$; $X(D\mathbf{5}_2)$; $X(D\mathbf{5}_3)$} to a next repeater device $C_2$.

After receiving the control signal sequence sent by the repeater device $C_1$, the middle repeater device $C_2$ retains first 3 control signals {$X(D\mathbf{2}_1)$; $X(D\mathbf{2}_2)$; $X(D\mathbf{2}_3)$} according to first-LED-count 3 currently configured for the middle repeater device; and the 3 control signals are configured to control the LED light string ($D\mathbf{2}_1$, $D\mathbf{2}_2$, $D\mathbf{2}_3$) where the repeater device $C_2$ is located. The head-end repeater device transmits remaining control signal sequences {$X(D\mathbf{3}_1)$; $X(D\mathbf{3}_2)$; $X(D\mathbf{3}_3)$; $X(D\mathbf{4}_1)$; $X(D\mathbf{4}_2)$; $X(D\mathbf{4}_3)$; $X(D\mathbf{5}_1)$; $X(D\mathbf{5}_2)$; $X(D\mathbf{5}_3)$} to a next repeater device $C_3$.

After receiving the control signal sequence sent by the repeater device $C_4$, the tail-end repeater device $C_5$ retains first 3 control signals {$X(D\mathbf{5}_1)$; $X(D\mathbf{5}_2)$; $X(D\mathbf{5}_3)$} according to first-LED-count 3 currently configured for the middle repeater device; and the 3 control signals are configured to control the LED light string ($D\mathbf{5}_1$, $D\mathbf{5}_2$, $D\mathbf{5}_3$) where the repeater device $C_5$ is located.

It can be learned that, in this embodiment, the LED light-emitting element is a power element and is easy to damage after long-time operation, while the repeater device is a non-power element and is not easy to damage after long-time operation. Therefore, when one of the LED light-emitting elements is damaged (for example, $D\mathbf{1}_2$ is damaged in FIG. 2), only the transmission of the control signal in the LED light string ($D\mathbf{1}_1$, $D\mathbf{1}_2$, $D\mathbf{1}_3$) where the LED light-emitting element ($D\mathbf{1}_2$) is located is affected, other LED light strings in a parallel link are not affected, and the normal operation of the other LED light strings in the parallel link may be ensured. In other words, the added repeater device, even when one of the LED light-emitting elements fails, still bypasses an LED light string where this failure point is located, and continue to transmit the control signal sequence forward through the repeater device, so as to ensure that LED light-emitting elements in remaining LED light strings may still work normally.

Figure 3:
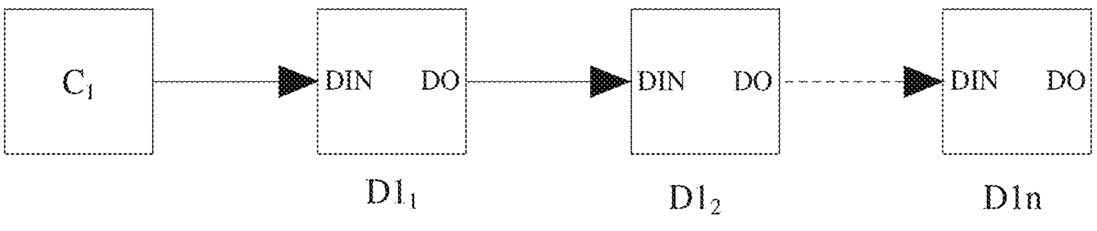
FIG. 3 is a schematic diagram of a circuit connection relationship between a first expansion output interface and a first expansion input interface according to an embodiment of the present disclosure.

In a possible implementation, as shown in FIG. 3, each LED light-emitting element in the LED light string is provided with a first expansion input interface (DIN) and a first expansion output interface (DO).

Two adjacent LED light-emitting elements in the LED light string are electrically connected or separated through a first expansion input interface on one LED light-emitting element and a first expansion output interface on the other LED light-emitting element, so as to change the LED light-emitting elements connected in series in the LED light string; and a first expansion output interface is retained on an LED light-emitting element at a tail part of the LED light string, and the first expansion output interface is configured to expand and connect first expansion input interfaces of other LED light-emitting elements in series at the tail part of the LED light string.

For example, between two LED light-emitting elements (e.g., $D\mathbf{1}_1$ and $D\mathbf{1}_2$) connected in series, a first signal output interface (DO) of an upstream LED light-emitting element ($D\mathbf{1}_1$) is electrically connected to or separated from a first signal input interface (DIN) of a downstream LED light-emitting element ($D\mathbf{1}_2$), so that the number of LED light-emitting elements connected in series in an LED light string may be dynamically changed through this split structure, and/or a damaged LED light-emitting element in the LED light string may be dynamically replaced online. The upstream and the downstream are determined according to a transmission direction of the control signal. Specifically, the control signal is transmitted from the upstream LED light-emitting element to the downstream LED light-emitting element.

In this embodiment, no matter in the construction or use process of the reconfigurable LED display screen, if a user wants to increase the number of LED light-emitting elements in any one of LED light strings in the reconfigurable LED display screen, the user may connect a first expansion input interface of a newly added LED light-emitting element to a first expansion output interface of an LED light-emitting element at a tail part of the LED light string.

If a user wants to reduce the number of LED light-emitting elements in the LED light string, the user may reduce the number of LED light-emitting elements from the tail part of the LED light string, and separate a first expansion input interface of a front-most LED light-emitting element among at least one LED light-emitting element to be removed from a first expansion output interface of a previous LED light-emitting element of this front-most LED light-emitting element. For example, as shown in FIG. 2, if a user wants to reduce one LED light-emitting element in the LED light string, the user may separate a first expansion input interface of $D1_n$ from a first expansion output interface of $D1_{n-1}$, so that $D1_n$ may be removed from the LED light string.

If a user wants to replace a damaged LED light-emitting element (e.g., $D1_2$) in the LED light string, the user may separate a first expansion input interface of the damaged LED light-emitting element (e.g., $D1_2$) from a first expansion output interface of a previous LED light-emitting element (e.g., $D1_1$) of the damaged LED light-emitting element, and separate a first expansion output interface of the damaged LED light-emitting element (e.g., $D1_2$) from a first expansion input interface of a next LED light-emitting element (e.g., $D1_3$) of the damaged LED light-emitting element, thereby removing the damaged LED light-emitting element (e.g., $D1_2$) from the LED light string. Then, the user connects a first expansion input interface of a new LED light-emitting element to the first expansion output interface of the previous LED light-emitting element (e.g., $D1_1$) of the damaged LED light-emitting element, and connects a first expansion output interface of the new LED light-emitting element to the first expansion input interface of the next LED light-emitting element (e.g., $D1_3$) of the damaged LED light-emitting element, so as to replace the original damaged LED light-emitting element with the new LED light-emitting element.

It can be learned that, in this embodiment, no matter in the construction or use process of the reconfigurable LED display screen, a length of each LED light string in the reconfigurable LED display screen may be dynamically adjusted based on a use requirement (that is, the number of the LED light-emitting elements connected in series in each LED light string is dynamically adjusted). Meanwhile, when there is a damaged LED light-emitting element in the LED light strings, the damaged LED light-emitting element may be flexibly replaced.

Figure 4:
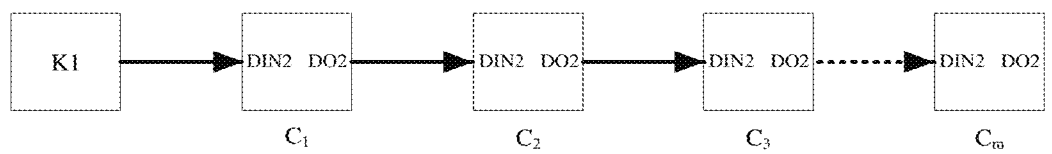
FIG. 4 is a schematic diagram of a circuit connection relationship between a second expansion output interface and a second expansion input interface according to an embodiment of the present disclosure.

In a possible implementation, as shown in FIG. 4, a second expansion input interface (DIN2) and a second expansion output interface (DO2) are provided on each repeater device on the main signal line;

- two adjacent repeater devices on the main signal line are electrically connected or separated through a second expansion input interface on one repeater device and a second expansion output interface on the other repeater device, so as to change the repeater devices connected in series to the main signal line; and
- a second expansion output interface is retained on a repeater device located at a tail part on the main signal line, and the second expansion output interface is configured to expand and connect second expansion input interfaces of other repeater devices in series on the repeater device located at the tail part on the main signal line.

For example, between two repeater devices (e.g., $C_1$ and $C_2$) connected in series to the main signal line, a second expansion output interface (DO2) of an upstream repeater device is electrically connected to or separated from a second expansion input interface (DIN2) of a downstream repeater device, so as to change the number of repeater devices connected in series to the main signal line, and/or replace a damaged repeater device among the repeater devices connected in series to the main signal line. The control signal sequence is transmitted from a repeater device located at the upstream of the main signal line to a repeater device located at the downstream of the main signal line.

In this embodiment, no matter in the construction or use process of the reconfigurable LED display screen, if a user wants to increase the number of the repeater devices on any one of main signal lines in the reconfigurable LED display screen, the user may connect a second expansion input interface of a newly added repeater device to a second expansion output interface of the repeater device located at the tail part of the main signal line.

If a user wants to reduce the number of repeater devices connected in series to any one of main signal lines in the reconfigurable LED display screen, the user can reduce the number of repeater devices from the tail part of the main signal line, where the tail part of the main signal line refers to one end far away from a control terminal. The user separates a second expansion input interface of a front-most repeater device among at least one repeater device to be removed from a second expansion output interface of a previous repeater device of this front-most repeater device. For example, as shown in FIG. 2, if a user wants to reduce one repeater device on the main signal line, the user may separate a second expansion input interface of $C_m$ from a second expansion output interface of $C_{m-1}$, so that $C_m$ may be removed from the main signal line.

It can be learned that, in this embodiment, no matter in the construction or use process of the reconfigurable LED display screen, a user may dynamically adjust the number of repeater devices connected in series to any one of main signal lines based on a use requirement, and replace damaged repeater devices in time.

In an embodiment of the present disclosure, the reconfigurable LED display screen includes at least one independent LED display unit, and when the reconfigurable LED display screen is actually used, the arrangement and display manner of LED light strings in LED display units in the physical world may be adjusted randomly based on use requirements or design of users.

Figure 5:
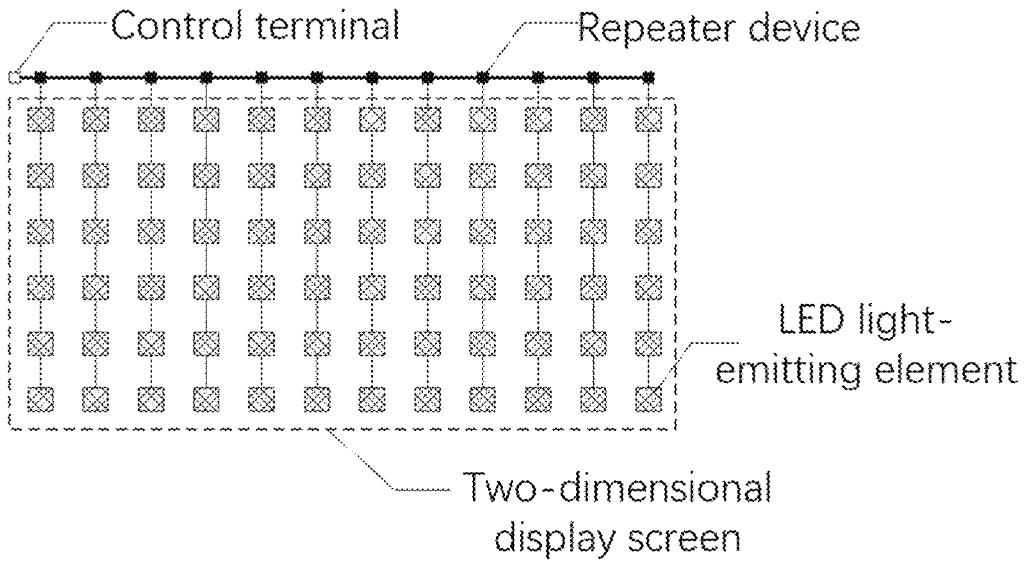
FIG. 5 is a schematic diagram of a first arrangement and placement manner of LED light strings in an LED display unit in the physical world when a reconfigurable LED display screen is actually used according to an embodiment of the present disclosure.
Figure 6:
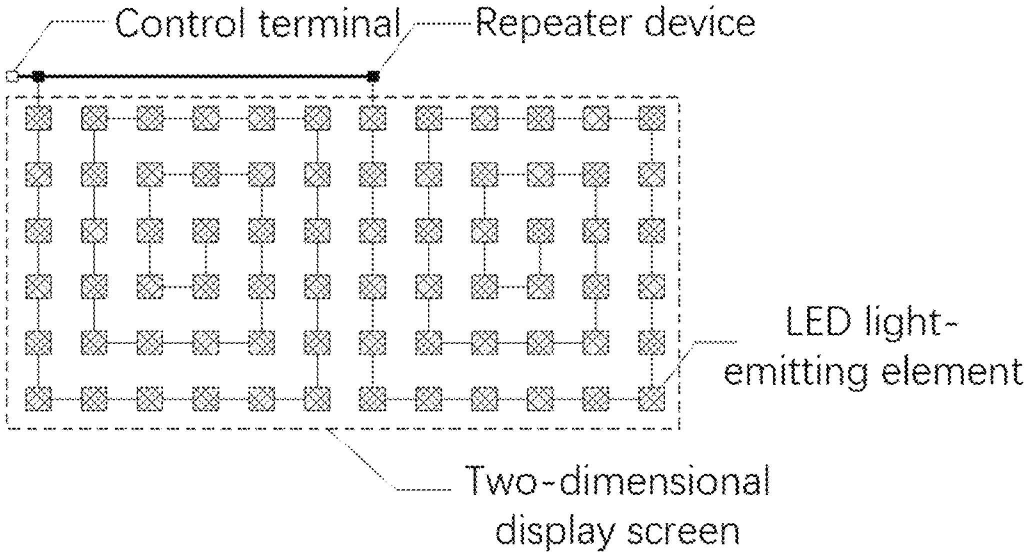
FIG. 6 is a schematic diagram of a second arrangement and placement manner of LED light strings in an LED display unit in the physical world when a reconfigurable LED display screen is actually used according to an embodiment of the present disclosure.
Figure 7:
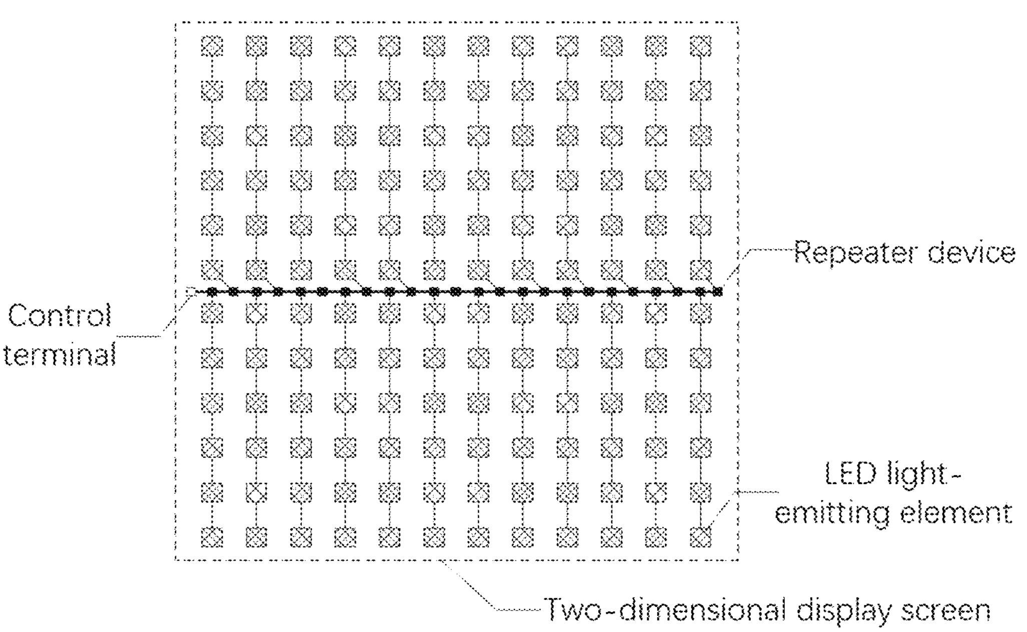
FIG. 7 is a schematic diagram of a third arrangement and placement manner of LED light strings in an LED display unit in the physical world when a reconfigurable LED display screen is actually used according to an embodiment of the present disclosure.
Figure 8:
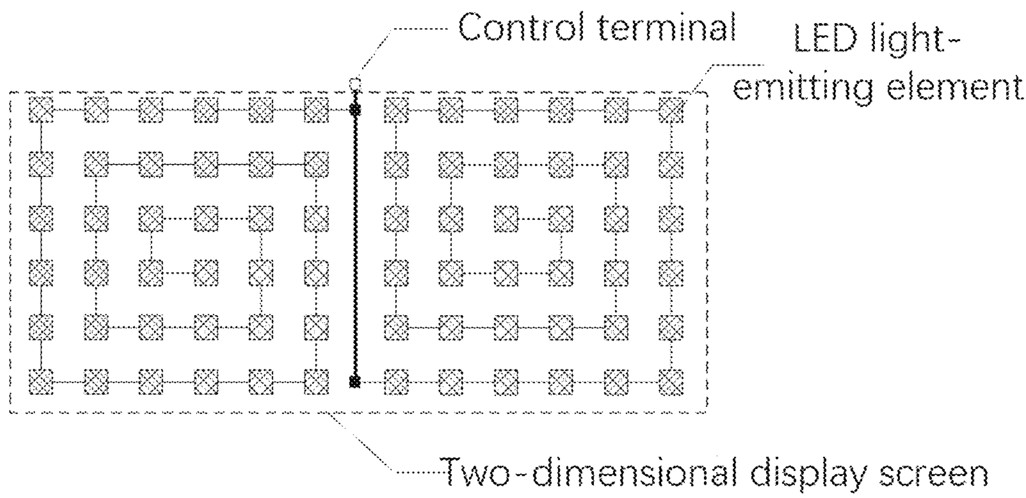
FIG. 8 is a schematic diagram of a fourth arrangement and placement manner of LED light strings in an LED display unit in the physical world when a reconfigurable LED display screen is actually used according to an embodiment of the present disclosure.

For example, first, taking an example that the reconfigurable LED display screen includes an independent LED display unit. In an actual physical use scenario, such as on an exterior wall of a building, as shown in FIG. 5, the LED light strings in the LED display unit may be arranged in parallel perpendicular to the ground, so as to form a two-dimensional display screen parallel to the plane of the exterior wall of the building. As shown in FIG. 6, the LED light strings in the LED display unit may be arranged based on a predetermined shape rule, for example, arranged in parallel in a square ring manner, to form two-dimensional display screens parallel to a plane of an exterior wall of a building. As shown in FIG. 7, some of the LED light strings (such as LED light strings with an odd arrangement order) in the LED display unit are arranged in parallel at one side, and the remaining LED light strings (such as LED light strings with an even arrangement order) are arranged in parallel at the other side, thereby forming a two-dimensional display screen. Or as shown in FIG. 8, some of the LED light strings in the LED display unit are arranged in parallel in a square ring manner at one side, and the remaining LED light strings are arranged in parallel in a square ring manner at the other side.

Figures 9, 10:
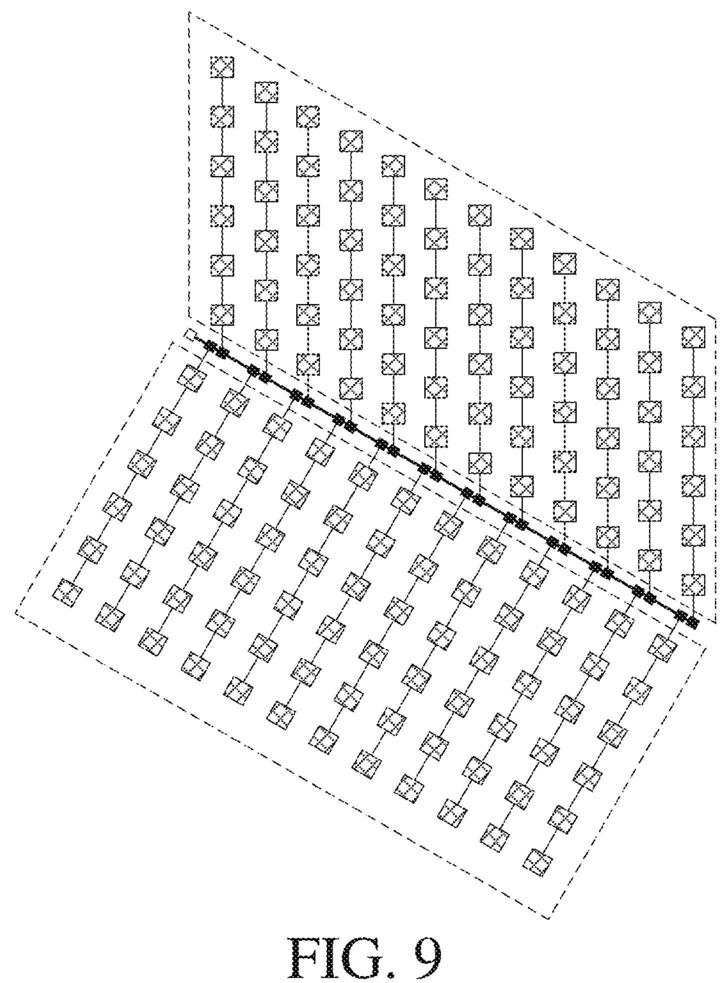
FIG. 9 is a schematic diagram of a fifth arrangement and placement manner of LED light strings in an LED display unit in the physical world when a reconfigurable LED display screen is actually used according to an embodiment of the present disclosure.
FIG. 10 is a schematic diagram of an arrangement and placement manner of LED light strings in an LED display unit including branch signal lines in the physical world when a reconfigurable LED display screen is actually used according to an embodiment of the present disclosure.

A three-dimensional screen may also be formed by the LED display unit. As shown in FIG. 9, some of the LED light strings in the LED display unit are arranged in parallel with the ground at a first included angle, and the remaining LED light strings are arranged in parallel with the ground at an included second angle, forming a triangular three-dimensional screen.

It should be noted that the examples shown in FIGS. 5 to 9 are merely exemplary descriptions, and the specific arrangement of the LED light strings in the physical use scenario of the present disclosure may be designed and arranged arbitrarily based on a use requirement of a user. In practical use, the control terminal and the repeater device may be hidden in the solid components such as a display screen housing of the reconfigurable LED display screen, and do not need to be displayed outside to be seen by audiences. Meanwhile, the distances between LED light-emitting elements shown in FIGS. 5 to 9 are merely exemplary and do not represent the distances between the LED light-emitting elements in an actual use scenario.

In this embodiment, the reconfigurable LED display screen may further include a plurality of independent LED display units. In a physical use scenario, the plurality of independent LED display units may be spliced at a physical position to form a completed reconfigurable LED display screen. The arrangement of the LED light strings in different LED display units in the reconfigurable LED display screen may be the same or different. For example, the reconfigurable LED display screen includes three independent LED display units, where the LED light strings in two independent LED display units are arranged as shown in FIG. 5, and the LED light strings in another independent LED display unit are arranged as shown in FIG. 7. The three LED display units are spliced together at a physical position to form a complete reconfigurable LED display screen.

The reconfigurable LED display screen may be a two-dimensional plane display screen (by arranging the three LED display units on the same physical plane) or a three-dimensional stereo display screen (by arranging one to two LED display units on one physical plane and arranging the remaining LED display units on another physical plane, the two physical planes form a certain angle).

In this embodiment, the size, dimensions and shape of the reconfigurable LED display screen may be changed by increasing or decreasing the number and arrangement of the LED display units and the number and arrangement positions of the LED light strings in each LED display unit.

In a possible implementation, as shown in FIG. 10, the LED display unit further includes a plurality of branch signal lines, and each repeater device on the main signal line is detachably connected to different branch signal lines; repeater devices in some LED light strings in the LED display screen are connected in series to the main signal line, and for remaining LED light strings, a repeater device in at least one of the remaining LED light strings is connected in series to each branch signal line; and two adjacent repeater devices on the branch signal line are connected in series via a detachable second series connection structure, so as to change the repeater devices connected in series to the branch signal line.

In this embodiment, each repeater device on the main signal line may be detachably connected to a branch signal line, and the branch signal lines connected to different repeater devices are different. The LED display unit includes a plurality of expandable LED light strings, where repeater devices in some LED light strings are connected in series with the main signal line, and the repeater devices connected in series to the main signal line may be used as primary repeater devices. The repeater devices in the remaining LED light strings in the LED display unit (i.e., repeater devices in the LED display unit that are not connected in series to the main signal line) are used as secondary repeater devices. At least one secondary repeater device is connected in series to each branch signal line.

In this embodiment, a plurality of LED light-emitting elements are connected in series to a repeater device on a main signal line (also referred to as a primary repeater device) or a repeater device on a branch signal line (also referred to as a secondary repeater device). As shown in FIG. 10, this structure may constitute a three-dimensional display screen.

In a possible implementation, if each repeater device on the main signal line is connected to a branch signal line, repeater devices at two ends of repeater devices connected in series to the branch signal line are respectively used as a branch head-end repeater device and a branch tail-end repeater device, and the branch head-end repeater device is connected to the repeater device on the main signal line; according to the control signal sequence configured for the LED display unit where the control terminal is located in the control terminal, an arrangement order of control signals is determined based on an arrangement order of the repeater devices on the main signal line, an arrangement order of the repeater devices on the branch signal line, and an arrangement order of the LED light-emitting element in the LED light string.

In this case, the repeater devices are arranged on the main signal line in the order from the main line head-end repeater device to the main line tail-end repeater device. That is, the main line head-end repeater device is arranged at the front and the main line tail-end repeater device is arranged at the back.

The repeater devices are arranged on the branch signal line in the order from the branch head-end repeater device to the branch tail end repeater device, where the branch head-end repeater device is arranged at the front, and the branch tail-end repeater device is arranged at the back.

The arrangement order of the LED light-emitting elements in the LED light string is arranged from the head-end LED light-emitting element to the tail-end LED light-emitting element. That is, the head-end LED light-emitting element is arranged at the front, and the tail-end LED light-emitting element is arranged at the back.

For example, as shown in FIG. 10, a control terminal K2, a repeater device $C'_1$, a repeater device $C'_2$, a repeater device $C'_3$, and a repeater device $C'_4$ are sequentially connected in series to the main signal line. A repeater device $C'_{11}$ and a repeater device $C'_{12}$ are connected in series to a branch signal line to which the repeater device $C'_1$ is connected. A repeater device $C'_{21}$ and a repeater device $C'_{22}$ are connected in series to a branch signal line to which the repeater device C'2 is connected. A repeater device $C'_{31}$ and a repeater device $C'_{32}$ are connected in series to a branch signal line to which the repeater device $C'_3$ is connected. A repeater device $C'_{41}$ and a repeater device $C'_{42}$ are connected in series to a branch signal line to which the repeater device $C'_4$ is connected. The repeater devices include $C'_1$, $C'_2$, $C'_3$, $C'_4$, $C'_{11}$, $C'_{12}$, $C'_{21}$, $C'_{22}$, $C'_{31}$, $C'_{32}$, $C'_{41}$, and $C'_{42}$.

Assuming that an LED light string where $C'_1$ is located includes two LED light-emitting elements connected in series from top to bottom: $D'_{11}$ and $D'_{12}$ (not marked in FIG. 10). An LED light string where the $C'_{11}$ is located includes two LED light-emitting elements connected in series from top to bottom: $D'_{111}$ and $D'_{112}$. An LED light string where the $C'_{12}$ is located includes two LED light-emitting elements connected in series from top to bottom: $D'_{121}$ and $D'_{122}$.

An LED light string where $C'_2$ is located includes two LED light-emitting elements connected in series from top to bottom: $D'_{21}$ and $D'_{22}$ (not marked in FIG. 10). An LED light string where the $C'_{21}$ is located includes two LED light-emitting elements connected in series from top to bottom: $D'_{211}$ and $D'_{212}$. An LED light string where the $C'_{22}$ is located includes two LED light-emitting elements connected in series from top to bottom: $D'_{221}$ and $D'_{222}$.

An LED light string where $C'_3$ is located includes two LED light-emitting elements connected in series from top to bottom: $D'_{31}$ and $D'_{32}$ (not marked in FIG. 10). An LED light string where the $C'_{31}$ is located includes two LED light-emitting elements connected in series from top to bottom: $D'_{311}$ and $D'_{312}$. An LED light string where the $C'_{32}$ is located includes two LED light-emitting elements connected in series from top to bottom: $D'_{321}$ and $D'_{322}$.

An LED light string where $C'_4$ is located includes two LED light-emitting elements connected in series from top to bottom: $D'_{41}$ and $D'_{42}$ (not marked in FIG. 10). An LED light string where the $C'_{41}$ is located includes two LED light-emitting elements connected in series from top to bottom: $D'_{411}$ and $D'_{412}$. An LED light string where the $C'_{42}$ is located includes two LED light-emitting elements connected in series from top to bottom: $D'_{421}$ and $D'_{422}$.

The arrangement order of control signals of LED light-emitting elements in the LED display unit is from front to back: $X(D'_{11})$, $X(D'_{12})$, $X(D'_{111})$, $X(D'_{112})$, $X(D'_{121})$, $X(D'_{122})$, X(D'21), $X(D'_{22})$, $X(D'_{211})$, $X(D'_{212})$, $X(D'_{221})$, $X(D'_{222})$, $X(D'_{31})$, $X(D'_{32})$, $X(D'_{311})$, $X(D'_{312})$, $X(D'_{321})$, $X(D'_{322})$, $X(D'_{41})$, $X(D'_{42})$, $X(D'_{411})$, $X(D'_{412})$, $X(D'_{421})$, and $X(D'_{422})$.

Therefore, the control signal sequence of the LED display unit is as follows: $\{X(D'_{11})$, $X(D'_{12})$, $X(D'_{11})$, $X(D'_{112})$, $X(D'_{121})$, $X(D'_{122})$, $X(D'_{21})$, $X(D'_{22})$, $X(D'_{211})$, $X(D'_{212})$, $X(D'_{221})$, $X(D'_{222})$, $X(D'_{31})$, $X(D'_{32})$, $X(D'_{311})$, $X(D'_{312})$, $X(D'_{321})$, $X(D'_{322})$, $X(D'_{41})$, $X(D'_{42})$, $X(D'_{411})$, $X(D'_{412})$, $X(D'_{421})$, $X(D'_{422})\}$. Taking the control signal $X(D'_{11})$ as an example, $X(D'_{11})$ refers to a control signal of the LED light-emitting element $D'_{11}$, and other control signals are not described again.

In this example, since an LED light string where each repeater device ($C'_1C'_2$, $C'_3$, $C'_4$, $C'_1$, $C'_{12}$, $C'_{21}$, $C'_{22}$, $C'_{31}$, $C'_{32}$, $C'_{41}$, or $C'_{42}$) is located includes two LED light-emitting elements connected in series, first-LED-count currently configured for each repeater device is 2.

Meanwhile, for each repeater device ($C'_1$, $C'_2$, $C'_3$, or $C'_4$) on the main signal line, a total number of LED light-emitting elements connected in series in each LED light string on the branch signal line connected to the repeater device is 4, and the first-LED-count currently configured for the repeater device is 2, so that second-LED-count currently configured for the repeater device is 6.

In this case, the repeater device, when configured to, after receiving the control signal sequence, retain first first-LED-count control signals according to first-LED-count configured currently, control an LED light string where the repeater device is located by using the retained control signals, and forward remaining control signal sequences to a next repeater device, is specifically configured to:

when the repeater device is a repeater device on the main signal line, after receiving the control signal sequence, retain first second-LED-count control signals according to second-LED-count configured for the repeater device, transmit remaining control signal sequences to a next repeater device of the repeater device on the main signal line through the main signal line, retain first first-LED-count control signals according to first-LED-count configured for the repeater device, control an LED light string where the repeater device is located by using the retained control signals, and transmit remaining control signal sequences to a branch head-end repeater device on the branch signal line through the branch signal line, where the second-LED-count configured in the repeater device on the main signal line is a sum of the first-LED-count and a total number of LED light-emitting elements connected in series in LED light strings on a branch signal line connected to the repeater device; and when the repeater device is a repeater device on the branch signal line, after receiving the control signal sequence, retain first first-LED-count control signals, control the LED light string where the repeater device is located by using the retained control signals, and forward remaining control signal sequences to a next repeater device on the branch signal line through the branch signal line.

In a possible implementation, repeater devices at two ends of repeater devices connected in series to the main signal line are respectively used as a main line head-end repeater device and a main line tail-end repeater device, and the main line head-end repeater device is connected in series with the control terminal.

In this embodiment, in the actual working process of the reconfigurable LED display screen, for each LED display unit in the reconfigurable LED display screen, a control terminal in the LED display unit transmits a control signal sequence of the LED display unit to a main line head-end repeater device in the LED display unit.

In a case that the repeater device is a repeater device on the main signal line, the repeater device, when configured to, after receiving the control signal sequence, retain first second-LED-count control signals according to second-LED-count configured for the repeater device, transmit remaining control signal sequences to a next repeater device of the repeater device on the main signal line through the main signal line, retain first first-LED-count control signals according to first-LED-count configured for the repeater device, control an LED light string where the repeater device is located by using the retained control signals, and transmit remaining control signal sequences to a branch head-end repeater device on the branch signal line through the branch signal line, is specifically configured to:

the repeater device on the main signal line, when configured to, after receiving the control signal sequence, retain first second-LED-count control signals according to second-LED-count configured for the repeater device, transmit remaining control signal sequences to a next repeater device of the repeater device on the main signal line through the main signal line, retain first first-LED-count control signals according to first-LED-count configured for the repeater device, control an LED light string where the repeater device is located by using the retained control signals, and transmit remaining control signal sequences to a branch head-end repeater device on the branch signal line through the branch signal line, is specifically configured to:

when the repeater device is a main line head-end repeater device, receive a control signal sequence from the control terminal in an LED display unit where the repeater device is located, retain first second-LED-count control signals in the control signal sequence according to the second-LED-count configured for the repeater device, transmit remaining control signal sequences to a next repeater device of the repeater device on the main signal line through the main signal line, retain first first-LED-count control signals from the second-LED-count control signals retained for the repeater device according to the first-LED-count configured for the repeater device, control an LED light string where the repeater device is located by using the retained control signals, transmit remaining control signal sequences in the second-LED-count control signals retained for the repeater device to a branch head-end repeater device on the branch signal line through the branch signal line connected with the repeater device; and when the repeater device is a main line non-head-end repeater device, receive a control signal sequence transmitted from a previous repeater device of the main line non-head-end repeater device on the main signal line, retain first second-LED-count control signals in the control signal sequence according to the second-LED-count configured for the repeater device, transmit remaining control signal sequences to a next repeater device of the main line non-head-end repeater device on the main signal line if the main line non-head-end repeater device is not a main line tail-end repeater device; or complete transmission of the control signal sequence on the main signal line where the repeater device is located if the main line non-head-end repeater device is a main line tail-end repeater device, retain first first-LED-count control signals according to the first-LED-count configured for the repeater device, control an LED light string where the repeater device is located by using the retained control signals, and transmit remaining control signal sequences to a branch head-end repeater device on the branch signal line through the branch signal line connected with the repeater device.

In this embodiment, the main line head-end repeater device (e.g., $C'_1$ in FIG. 10) is configured to: after receiving a control signal sequence (e.g., {$X(D'_{11})$, $X(D'_{12})$, $X(D'_{111})$, $X(D'_{112})$, $X(D'_{121})$, $X(D'_{122})$, $X(D'_{21})$, $X(D'_{22})$, $X(D'_{211})$, $X(D'_{212})$, $X(D'_{221})$, $X(D'_{222})$, $X(D'_{31})$, $X(D'_{32})$, $X(D'_{311})$, $X(D'_{312})$, $X(D'_{321})$, $X(D'_{322})$, $X(D'_{41})$, $X(D'_{42})$, $X(D'_{411})$, $X(D'_{412})$, $X(D'_{421})$, $X(D'_{422})$}) transmitted by a control terminal (e.g., K2 in FIG. 10), retain first second-LED-count control signals (e.g., $X(D'_{11})$, $X(D'_{12})$, $X(D'_{111})$, $X(D'_{112})$, $X(D'_{121})$, and $X(D'_{122})$) in the control signal sequence according to second-LED-count configured for the main line head-end repeater device (e.g., 6), and transmit remaining control signals (e.g., $X(D'_{21})$, $X(D'_{22})$, $X(D'_{211})$, $X(D'_{212})$, $X(D'_{221})$, $X(D'_{222})$, $X(D'_{31})$, $X(D'_{32})$, $X(D'_{311})$, $X(D'_{312})$, $X(D'_{321})$, $X(D'_{322})$, $X(D'_{41})$, $X(D'_{42})$, $X(D'_{411})$, $X(D'_{412})$, $X(D'_{421})$, $X(D'_{422})$) to a next repeater device (e.g., $C'_2$ in FIG. 10) of the main line head-end repeater device through the main signal line; and retain first first-LED-count control signals (for example, retain $X(D'_{11})$ and $X(D'_{12})$) from the second-LED-count control signals retained for the main line head-end repeater device according to first-LED-count (e.g., 2) configured for the main line head-end repeater device, control an LED light string where the main line head-end repeater device (e.g., $C'_1$ in FIG. 10) is located by using the retained control signals, and transmit remaining control signal sequences (e.g., $X(D'_{11})$, $X(D'_{112})$, $X(D'_{121})$, and $X(D'_{122})$) in the second-LED-count control signals retained for the main line head-end repeater device to a branch head-end repeater device (e.g., $C'_{11}$ in FIG. 10) on the branch signal line through the branch signal line connected by the main line head-end repeater device.

A maonline middle repeater device (i.e., a repeater device that is neither the main line head-end repeater device nor the main line tail-end repeater device on the main signal line, e.g., $C'_2$ in FIG. 10) is configured to: after receiving a control signal sequence transmitted from a previous repeater device (e.g., $C'_1$ in FIG. 10) of the maonline middle repeater device on the main signal line, retain first second-LED-count control signals (for example, retain $X(D'_{21})$, $X(D'_{22})$, $X(D'_{211})$, $X(D'_{212})$, $X(D'_{221})$, $X(D'_{222})$) in the control signal sequence according to second-LED-count configured for the maonline middle repeater device (e.g., 6), and transmit remaining control signal sequences (e.g., $X(D'_{31})$, $X(D'_{32})$, $X(D'_{311})$, $X(D'_{312})$, $X(D'_{321})$, $X(D'_{322})$, $X(D'_{41})$, $X(D'_{42})$, $X(D'_{411})$, $X(D'_{412})$, $X(D'_{421})$, and $X(D'_{422})$) to a next repeater device (e.g., $C'_3$ in FIG. 10) of the repeater device on the main signal line through the main signal line; and retain first first-LED-count control signals (for example, retain $X(D'_{21})$ and $X(D'_{22})$) from the second-LED-count control signals retained for the maonline middle repeater device according to first-LED-count (e.g., 2) configured for the maonline middle repeater device, control an LED light string where the maonline middle repeater device (e.g., $C'_2$ in FIG. 10) is located by using the retained control signals, and transmit remaining control signal sequences (e.g., $X(D'_{211})$, $X(D'_{212})$, $X(D'_{221})$, and $X(D'_{222})$) in the second-LED-count control signals retained for the maonline middle repeater device to a branch head-end repeater device (e.g., $C'_{21}$ in FIG. 10) on the branch signal line through the branch signal line connected by the main line head-end repeater device.

A main line tail-end repeater device (e.g., $C'_4$ in FIG. 10) is configured to: receive a control signal sequence (e.g., $X(D'_{41})$, $X(D'_{42})$, $X(D'_{411})$, $X(D'_{412})$, $X(D'_{421})$, and $X(D'_{422})$) transmitted from a previous repeater device (e.g., $C'_3$ in FIG. 10) of the main line tail-end repeater device on the main signal line, and retain first second-LED-count control signals (for example, retain $X(D'_{41})$, $X(D'_{42})$, $X(D'_{411})$, $X(D'_{412})$, $X(D'_{421})$, and $X(D'_{422})$) in the control signal sequence according to second-LED-count (e.g., 6) configured for the main line tail-end repeater device; and retain first first-LED-count control signals (for example, retain $X(D'_{41})$ and $X(D'_{42})$) from the second-LED-count control signals retained for the main line tail-end repeater device according to first-LED-count (e.g., 2) configured for the main line tail-end repeater device, control an LED light string where the main line tail-end repeater device (e.g., $C'_4$ in FIG. 10) is located by using the retained control signals, and transmit remaining control signal sequences (for example, $X(D'_{411})$, $X(D'_{412})$, $X(D'_{421})$, and $X(D'_{422})$) in the second-LED-count control signals retained for the main line tail-end repeater device to a branch head-end repeater device (e.g., $C'_{41}$ in FIG. 10) on the branch signal line through the branch signal line connected by the main line tail-end repeater device.

In this embodiment, the next repeater device of the repeater device on the main signal line refers to: among the repeater devices connected in series with the repeater device on the main signal line, an adjacent repeater device located after (downstream of) the repeater device in the order from the main line head-end repeater device to the main line tail-end repeater device. The previous repeater device of the repeater device on the main signal line refers to: among the repeater devices connected in series with the repeater device on the main signal line, an adjacent repeater device located before (upstream of) the repeater device in the order from the main line head-end repeater device to the main line tail-end repeater device.

In a possible implementation, the repeater device on the branch signal line is configured to, after receiving the control signal sequence, retain first first-LED-count control signals, control the LED light string where the repeater device is located by using the retained control signals, and forward remaining control signal sequences to a next repeater device on the branch signal line through the branch signal line, specifically:

- the branch head-end repeater device on the branch signal line is configured to: receive a control signal sequence transmitted from a repeater device that is connected to the branch signal line and located on the main signal line, retain first first-LED-count control signals according to first-LED-count configured for the branch head-end repeater device, control an LED light string where the branch head-end repeater device is located by using the retained control signals, and forward remaining control signal sequences to a next repeater device on the branch signal line through the branch signal line;
- the branch middle repeater device on the branch signal line is configured to: receive a control signal sequence transmitted from a previous repeater device of the branch middle repeater device on the branch signal line, retain first first-LED-count control signals according to first-LED-count configured for the branch middle repeater device, control an LED light string where the branch middle repeater device is located by using the retained control signals, and forward remaining control signal sequences to a next repeater device on the branch signal line through the branch signal line; and
- the branch tail-end repeater device on the branch signal line is configured to: receive a control signal sequence transmitted from a previous repeater device of the branch tail-end repeater device on the branch signal line, retain first first-LED-count control signals according to first-LED-count configured for the branch tail-end repeater device, and control an LED light string where the branch tail-end repeater device is located by using the retained control signals.

In a possible implementation, each repeater device on the branch signal line is provided with a second expansion input interface and a second expansion output interface. On the branch signal line, two adjacent repeater devices are electrically connected or separated through a second expansion input interface on one repeater device and a second expansion output interface on the other repeater device, so that the repeater devices connected in series to the branch signal line are changed; and a second expansion output interface is retained on a repeater device located at a tail part on the branch signal line, and the second expansion output interface is configured to expand and connect second expansion input interfaces of other repeater devices in series on the repeater device located at the tail part on the branch signal line.

In this embodiment, each repeater device on the branch signal line is provided with the second expansion input interface and the second expansion output interface, so that the number of the repeater devices connected in series to the branch signal line may be dynamically changed, and/or a damaged repeater device in the repeater devices connected in series to the branch signal line may be dynamically replaced. For a detailed explanation, reference is made to FIG. 4 and a corresponding text description. This is not repeatedly described in the present disclosure.

In a possible implementation, if a repeater device in an LED display unit is not connected to a branch signal line, a cross-sectional area of a main signal line is larger than that of an auxiliary signal line.

In this embodiment, as shown in FIG. 2, the control terminal of the LED display unit and the repeater devices on the main signal line are connected in series via one main signal line, and the repeater devices in the LED light string and the LED light-emitting elements are connected in series via one auxiliary signal line. That is to say, the entire LED display unit in this embodiment is driven by the same main signal line, and the structure is simple, which is beneficial to reducing the production cost.

Meanwhile, when the control signal sequence is transmitted, a control signal sequence for controlling the entire LED display unit is transmitted through the main signal line while the auxiliary signal lines are configured only to transmit control signals of LED light-emitting elements in an LED light string where a repeater device is located, it may be considered that a current flowing through the main signal line is a sum of currents flowing through the auxiliary signal lines included in the LED display unit, and therefore, a cross-sectional area of the main signal line is larger than that of the auxiliary signal lines.

In a possible implementation, as shown in FIG. 10, if the repeater devices in some LED light strings in the LED display unit are connected in series to one main signal line, and the repeater devices in the remaining LED light strings are connected in series to the corresponding branch signal lines, the LED light-emitting elements in the LED light strings are connected in series through one auxiliary signal line; the cross-sectional area of the main signal line is larger than that of the branch signal line, and the cross-sectional area of the branch signal line is larger than that of the auxiliary signal line.

In this embodiment, the entire LED display unit is driven by the same main signal line, and for each branch signal line, the branch signal line is configured to drive the LED light strings on the branch signal line. That is, when the control signal sequence is transmitted, the control signal sequence for controlling the entire LED display unit is transmitted through the main signal line, and the control signal sequence for controlling at least one LED light string on the entire branch signal line needs to be transmitted through the branch signal line. In this case, it may be considered that the current flowing through the main signal line is the sum of the currents flowing through the fractional signal lines included in the LED display unit, and the current flowing through the branch signal lines is the sum of the currents flowing through the auxiliary signal lines on the branch signal line, so the cross-sectional area of the main signal line is larger than the cross-sectional area of the branch signal line, and the cross-sectional area of the branch signal line is larger than the cross-sectional area of the auxiliary signal line.

In a possible implementation, the cross-sectional areas of the auxiliary signal lines in different LED light strings may be the same or different. Specifically, when the difference in the number of LED light-emitting elements connected in series in different LED light strings is small, the cross-sectional areas of the auxiliary signal lines in the LED light strings may be the same; when the difference in the number of the LED light-emitting elements connected in series in different LED light strings is great, the cross-sectional areas of the auxiliary signal lines in the LED light strings may be determined according to the number of the LED light-emitting elements connected in series in the LED light string, where the cross-sectional area of the auxiliary signal line in the LED light string is positively correlated with the number of the LED light-emitting elements connected in series in the LED light string.

Similarly, the cross-sectional areas of different branch signal lines may be the same or different. When the difference in the number of LED light strings connected in different branch signal lines is small (or difference in the number of LED light-emitting elements included in the LED light strings connected in different branch signal lines is small), the cross-sectional areas of the branch signal lines may be the same. When the difference in the number of LED light strings connected in different branch signals is great (or the difference in the number of LED light-emitting elements included in the LED light strings connected in different branch signal lines is great), the cross-sectional areas of the branch signal lines are determined according to the number of LED light strings connected (or the number of LED light-emitting elements included in the LED light strings connected in different branch signal lines), where the cross-sectional area of the branch signal line is positively correlated with the number of LED light strings connected on the branch signal line (or the number of LED light-emitting elements included in the LED light strings connected in different branch signal lines).

In a possible implementation, the control signal is a color control signal, where the color control signal is a signal with a first bit number; the color control signal is an RGB color control signal or a WRGB color control signal; the control signal sequence is transmitted by a return-to-zero code protocol, and a signal transmission rate of the return-to-zero code protocol is a first rate;

a number of the LED light-emitting elements connected in series in each LED light string is not more than a first number, so that a refresh rate of the reconfigurable LED display screen reaches a target frame number refreshed by an image per second; and the first number is a ratio of a first data amount to be transmitted per frame to the first bit number, and the first data amount is a ratio of the first rate to the target frame number.

In this embodiment, the control signal for controlling the LED light-emitting element is a color control signal, and the color control signal is configured to control the chromaticity and brightness of the color displayed by the LED light-emitting element. The control signal sequence for controlling the LED display unit is actually a color control signal sequence.

Specifically, the RGB color control signals include: a blue control signal configured to regulate and control the chromaticity and brightness of a blue LED element in the LED light-emitting element, a red control signal configured to regulate and control the chromaticity and brightness of a red LED element in the LED light-emitting element, and a yellow control signal configured to regulate and control the chromaticity and brightness of a yellow LED element in the LED light-emitting element.

The WRGB color control signals include: a blue control signal configured to regulate and control the chromaticity and brightness of a blue LED element in the LED light-emitting element, a red control signal configured to regulate and control the chromaticity and brightness of a red LED element in the LED light-emitting element, a yellow control signal configured to regulate and control the chromaticity and brightness of a yellow LED element in the LED light-emitting element, and a white control signal configured to regulate and control the chromaticity and brightness of a white LED element in the LED light-emitting element.

Typically, the color control signal is a 24-bit signal. That is, the first bit number is typically 24 bits.

In the LED display unit, the control signal sequence is transmitted by a return-to-zero code protocol. Specifically, the control signal sequence transmitted by the control terminal to the head-end repeater device (or main line head-end repeater device), the control signal sequence transmitted between the repeater devices, the control signal sequence sent by the repeater device to the head-end LED light-emitting elements, and the control signal sequence transmitted between the LED light-emitting elements are transmitted by a return-to-zero code protocol.

The refresh rate of LED display screens in the prior art is usually low. In this embodiment, to increase the refresh rate of the reconfigurable LED display screen and make the refresh rate of the reconfigurable LED display screen reach 40 frames per second, the signal transmission rate of the return-to-zero code protocol is set to 800 kbps (that is, the first rate is 800 kbps), and the number of LED light-emitting elements connected in series in each LED light string is ensured to be no more than 833, so that the refresh rate of the reconfigurable LED display screen in this embodiment may reach 40 frames per second.

Specifically, currently, the signal transmission rate of the return-to-zero code protocol may reach a maximum of 800 kbps and a minimum of 400 kbps. To make the reconfigurable LED display screen reach the refresh rate of 40 frames per second, i.e., to make the reconfigurable LED display screen refresh 40 frames of images per second (a target frame number is equal to 40), the signal transmission rate of the return-to-zero code protocol is set to 800 kbps, i.e., the first rate is 800 kbps.

The first rate=800 kbps=800000 bits/s, the first data amount to be transmitted at 40 fps is 800000/40=20000 bits. Since each color control signal is 24 bits (i.e., the first bit number is equal to 24), the first data amount of 20000 bits may approximately support the transmission of 833 control signals, and the first number=20000/24=833.3333333.

That is, in a case of the return-to-zero code protocol with a first rate of 800 kbps, the number of LED light-emitting elements connected in series in each LED light string should not exceed 833 (the first number) to achieve a refresh rate of 40 frames per second.

In a possible implementation, the LED light-emitting elements in the LED display screens in the prior art are fixed and cannot be replaced arbitrarily. In this embodiment, the number of LED light-emitting elements in each LED light string may be dynamically changed online, and the reason why a damaged LED light-emitting element may be replaced at any time is that the repeater device in this embodiment is a read-write device. Specifically, a read-write memory is arranged in the repeater device, and the first-LED-count configured in the repeater device is written into the read-write memory;

the repeater device, when configured to retain the first first-LED-count control signals according to the first-LED-count configured currently, is specifically configured to:

read the written first-LED-count from the read-write memory, and retain the first first-LED-count control signals in the received control signal sequence according to the read first-LED-count.

In a possible implementation, after construction and before use, the reconfigurable LED display screen is subjected to initialization configuration on first-LED-count of individual repeater devices in the reconfigurable LED display screen by the following manners:

for each repeater device in the reconfigurable LED display screen, receiving, from the control terminal in the LED display unit where the repeater device is located, a first repeater configuration parameter initialized and configured for the repeater device through a serial port protocol, where the first repeater configuration parameter includes an initialized first-LED-count; and writing the first-LED-count included in the first repeater configuration parameter into a read-write memory of the repeater device, so as to perform initialization repeater parameter configuration on the repeater device.

In a possible implementation, when a user needs to dynamically change the number of the LED light-emitting elements connected in series in any one of LED light strings in the reconfigurable LED display online and/or replace a damaged LED light-emitting element in any one of the LED light strings during the use of the reconfigurable LED display, the user may reconfigure first-LED-count configured in the repeater device online, thereby implementing the reconfiguration of the LED display screen.

Specifically, in the use process of the reconfigurable LED display screen, for any one of LED display units in the reconfigurable LED display screen, if there is a change in LED light-emitting elements connected in series in at least one LED light string in the LED display unit (including increasing the number of LED light-emitting elements connected in series in the LED light string, reducing the number of LED light-emitting elements connected in series in the LED light string, or replacing a damaged LED light-emitting element in the LED light string), the first-LED-count in individual repeater devices in the LED display unit is configured online by the following manners:

for each repeater device in the LED display unit, receiving, from the control terminal in the LED display unit, a first repeater configuration parameter reconfigured for the repeater device through a serial port protocol, where the reconfigured first repeater configuration parameter includes first-LED-count reconfigured for the repeater device online; the first-LED-count reconfigured for the repeater device online is equal to a number of LED light-emitting elements connected in series currently in an LED light string where the repeater device is located; and writing the first-LED-count included in the first repeater configuration parameter into a read-write memory of the repeater device, and replacing the first-LED-count stored in the read-write memory with the first-LED-count reconfigured online, so as to update the first-LED-count in the repeater device online.

Similarly, in a possible implementation, the second-LED-count configured in the repeater device on the main signal line is written into the read-write memory;

the repeater device, when configured to retain the first second-LED-count control signals according to the second-LED-count configured for the repeater device, is specifically configured to:

read the written second-LED-count from the read-write memory, and retain the first second-LED-count control signals in the received control signal sequence according to the read second-LED-count.

In a possible implementation, after construction and before use, the reconfigurable LED display screen is subjected to initialization configuration on second-LED-count of individual repeater devices on the main signal line in the reconfigurable LED display screen by the following manners, for each repeater device on the main signal line in the reconfigurable LED display screen, receiving, from the control terminal in the LED display unit where the repeater device is located, a second repeater configuration parameter initialized and configured for the repeater device through a serial port protocol, where the second repeater configuration parameter includes initialized second-LED-count; and writing the second-LED-count included in the second repeater configuration parameter into a read-write memory of the repeater device, so as to perform initialization repeater parameter configuration on the repeater device.

In a possible implementation, when a user needs to dynamically change the number of the LED light-emitting elements connected in series in any one of LED light strings in the reconfigurable LED display online and/or replace a damaged LED light-emitting element in any one of the LED light strings during the use of the reconfigurable LED display, the user may reconfigure second-LED-count configured in the repeater device on the main signal line online, thereby implementing the reconfiguration of the LED display screen.

Specifically, in the use process of the reconfigurable LED display screen, for any one of LED display units in the reconfigurable LED display screen, if there is a change in LED light-emitting elements connected in series in at least one LED light string in the LED display unit (including increasing the number of LED light-emitting elements connected in series in the LED light string, reducing the number of LED light-emitting elements connected in series in the LED light string, or replacing a damaged LED light-emitting element in the LED light string), the second-LED-count in individual repeater devices on the main signal line in the LED display unit is configured online by the following manners:

for each repeater device on the main signal line in the LED display unit, receiving, from a control terminal in the LED display unit, a second repeater configuration parameter reconfigured for the repeater device through a serial port protocol, where the second repeater configuration parameter includes second-LED-count reconfigured online for the repeater device; the second-LED-count reconfigured for the repeater device online is equal to a sum of the first-LED-count reconfigured for the repeater device online and a total number of the LED light-emitting elements currently connected in series in LED light strings on the branch signal line connected to the repeater device; and writing the second-LED-count included in the second repeater configuration parameter into a read-write memory of the repeater device, and replacing the second-LED-count stored in the read-write memory with the second-LED-count reconfigured online, so as to update the second-LED-count in the repeater device online.

In this embodiment, in the LED display unit, the repeater device located on the main signal line directly receives the first repeater configuration parameter and/or the second repeater configuration parameter sent by the control terminal through the main signal line.

The repeater device located on the branch signal line is configured to receive the first repeater configuration parameter sent by the control terminal through the main signal line and the branch signal line.

In this embodiment, since the existing repeater device is usually a read-only device, that is, the repeater number in the repeater device is fixed at the factory and cannot be edited and modified; it is impossible to increase, reduce, or replace the LED light-emitting elements in the LED light string based on the use requirements. Based on this, the read-write memory is built in the repeater device in this embodiment, and the read-write memory may be specifically a FLASH memory. With the read-write memory built in the repeater device, a user may edit and modify first-LED-count and second-LED-count of a repeater device on the main signal line, and edit and modify first-LED-count of a repeater device on a branch signal line, so that the LED light-emitting elements may be increased, decreased, or replaced in the LED light string as desired based on the use requirements.

Considering that in an actual application environment, a plurality of repeater devices may exist in the LED display unit, and there may be problems such as physical isolation or electrical interference between the repeater devices, it may be impossible to directly broadcast the same repeater configuration parameter (including a first repeater configuration parameter and a second repeater configuration parameter) to all the repeater devices to ensure that each repeater device can receive the same repeater device accurately. Therefore, a method of sending in batches is adopted. A complete serial command (i.e., a first repeater configuration parameter and/or a second repeater configuration parameter) is send for each repeater device needing to update first-LED-count and/or second-LED-count through a serial port protocol. Therefore, even if a certain repeater device fails to receive the first repeater configuration parameter and/or the second repeater configuration parameter due to a failure, updating of the first-LED-count and/or the second-LED-count of other repeater devices is not affected.

In a specific embodiment, when configuring first-LED-count and/or second-LED-count of each repeater device on the main signal line, the control terminal in the LED display unit separately sends the first-LED-count and/or the second-LED-count sequentially through the main signal line in an order from a tail-end repeater device (i.e., a main line tail-end repeater device) to a head-end repeater device (i.e., a main line head-end repeater device) through a serial port protocol.

When configuring first-LED-count of each repeater device on the branch signal line, the control terminal in the LED display unit separately sends the first-LED-count sequentially through the main signal line (i.e., the branch signal line) in an order from a branch tail-end repeater device to a branch head-end repeater device through a serial port protocol.

In this embodiment, as long as the LED light-emitting elements connected in series in any one of the LED light strings in the reconfigurable LED display screen are changed online (including changing the number of the LED light-emitting elements and replacing damaged LED light-emitting elements), the first-LED-count and the second-LED-count of each repeater device on the main signal line need to be reconfigured online, and the first-LED-count of each repeater device on the branch signal line needs to be reconfigured online.

In a possible implementation, the first repeater configuration parameter includes, in a sequential order: a first start delimiter, a first command code, a first-LED-count, a first check code and a first end delimiter; the first check code is obtained by performing an XOR operation on one or more pieces of data in the first start delimiter, the first command code, the first-LED-count and the first end delimiter by the control terminal;

for each repeater device (including a repeater device on a main signal line and a repeater device on a branch signal line) in an LED display unit, the writing the first-LED-count included in the first repeater configuration parameter into a read-write memory of the repeater device includes:

after receiving a first repeater configuration parameter for the repeater device sent by the control terminal, performing an XOR operation on one or more pieces of data in a first start delimiter, a first command code, a first-LED-count and a first end delimiter included in the received first repeater configuration parameter to obtain a first XOR value;

determining whether the first XOR value is consistent with the first check code, and if the first XOR value is consistent with the first check code, writing the first-LED-count included in the first repeater configuration parameter into the read-write memory of the repeater device; and if the first XOR value is inconsistent with the first check code, stopping writing the first-LED-count included in the first repeater configuration parameter into the read-write memory of the repeater device.

In this embodiment, the first start delimiter is configured to mark a start position of the first repeater configuration parameter; the first command code is configured to indicate the repeater device to be configured with a first-LED-count; the first-LED-count is a target value configured for the repeater device; the first check code is configured to check the correctness of the first repeater configuration parameter; and the first end delimiter is configured to indicate end of the entire first repeater configuration parameter.

Similarly, the second repeater configuration parameter includes, in a sequential order: a second start delimiter, a second command code, a second repeater number, a second check code and a second end delimiter; the second check code is obtained by performing an XOR operation on one or more pieces of data in the second start delimiter, the second command code, the second repeater number and the second end delimiter by the control terminal;

for a repeater device located on a main signal line in an LED display unit, the writing the second-LED-count included in the second repeater configuration parameter into a read-write memory of the repeater device includes:

after receiving a second repeater configuration parameter for the repeater device sent by the control terminal, performing an XOR operation on one or more pieces of data in a second start delimiter, a second command code, a second-LED-count and a second end delimiter included in the received second repeater configuration parameter to obtain a second XOR value;

determining whether the second XOR value is consistent with the second check code, and if the second XOR value is consistent with the second check code, writing the second-LED-count included in the second repeater configuration parameter into the read-write memory of the repeater device; and if the second XOR value is inconsistent with the second check code, stopping writing the second-LED-count included in the second repeater configuration parameter into the read-write memory of the repeater device.

In this embodiment, the second start delimiter is configured to mark a start position of the second repeater configuration parameter; the second command code is configured to indicate the repeater device to be configured with a second-LED-count; the second-LED-count is a target value configured for the repeater device; the second check code is configured to check the correctness of the second repeater configuration parameter; and the second end delimiter is configured to indicate end of the entire second repeater configuration parameter.

In this embodiment, to improve the reliability of the configuration process of the repeater number, a simple error detection method is adopted, that is, the result of the XOR operation between the transmission characters is used as a check code. The receiver may recalculate the XOR value according to the same algorithm and compare the XOR value with the received check code for consistency, so as to determine whether the repeater configuration parameters have changed during the transmission process.

It should be noted that the characters used by the first check code and/or the second check code sent by the control terminal in the calculation are the same as the characters used by the repeater device in the calculation of the first XOR value and/or the second check code. For example, when the characters used by the first check code sent by the control terminal in the calculation are the first start delimiter, the first command code, the first-LED-count and the first end delimiter, then the characters used by the repeater device in the calculation of the first XOR value are also the first start delimiter, the first command code, the first-LED-count and the first end delimiter.

In a possible implementation, when the reconfigurable LED display screen is in actual use, a distance between two adjacent LED light strings in the reconfigurable LED display screen at a physical position is a first distance; a distance between any two adjacent LED lights in the LED light string is a second distance, where two LED light strings that are adjacent at the physical position include: two LED light strings that are adjacent at the physical position and located in the same LED display unit, and/or two LED light strings that are adjacent at the physical position and located in different LED display units; and a distance between two adjacent LED lights in the LED light string at the physical position is a second distance. The first distance and the second distance are dynamically adjusted according to the current use scenario of the reconfigurable LED display screen. The use scenario includes any one or more of a user viewing distance, a display screen resolution and a display screen size, where the user viewing distance is positively correlated with the first distance and the second distance; the display screen resolution is in a negatively correlated with the first distance and the second distance; the display screen size is positively correlated with the first distance and the second distance; and the first distance and the second distance may be the same or different.

When the reconfigurable LED display screen includes a plurality of LED display units, the plurality of LED display units are arranged according to a preset geometric rule, and the preset geometric rule is dynamically adjusted based on the required display screen specification. The preset geometric rules include, but are not limited to, a rectangular array, a honeycomb array or a ring array.

In a possible implementation, for each frame of image to be displayed currently on the reconfigurable LED display screen, when the reconfigurable LED display screen includes one LED display unit, the control terminal includes a control signal sequence of this frame of image; when the reconfigurable LED display screen includes at least two LED display units, the control terminal in each LED display unit includes a control signal sequence of a partial image corresponding to the a physical position of this LED display unit in this frame of image.

In this embodiment, the reconfigurable LED display screen may sequentially display each frame of image according to the time sequence of each frame of image to be displayed currently.

For each frame of image to be displayed currently, when the reconfigurable LED display screen includes one LED display unit, the frame of image is completely displayed by this LED display unit.

When the reconfigurable LED display screen includes at least two LED display units, the at least two LED display units are required to cooperate with each other to synchronously and completely display this frame of image, and each LED display unit is required to synchronously display a partial image corresponding to the physical position of the LED display unit in this frame of complete image, so that the entire reconfigurable LED display screen synchronously displays this frame of complete image.

In a possible implementation, the LED light-emitting elements at two ends in the LED light string are respectively a head-end LED light-emitting element and a tail-end LED light-emitting element, and the head-end LED light-emitting element is connected to the repeater device;

the repeater device, when configured to control an LED light string where the repeater device is located by using the retained control signals, is specifically configured to:

based on the return-to-zero code protocol, transmit retained first-LED-count control signals to the head-end LED light-emitting element connected with the repeater device;

where the LED light-emitting element is configured to: when the LED light-emitting element works normally, retain a control signal for controlling the LED light-emitting element, control the LED light-emitting element by the retained control signal, and transmit remaining control signals to a next LED light-emitting element.

In this embodiment, after retaining first-LED-count control signals, the repeater device transmits all the control signals retained by the first repeater device to the head-end LED light-emitting element through the auxiliary signal line by using the return-to-zero code protocol, where the head-end LED light-emitting element is configured to: when this LED light-emitting element works normally, receive the first-LED-count control signals from the repeater device, retain the control signals of the head-end LED light-emitting element from the received control signals, control the display condition of the head-end LED light-emitting element by using the control signals, and transmit remaining control signals to a next LED light-emitting element;

the middle LED light-emitting element (i.e., an LED light-emitting element that is neither a head-end LED light-emitting element nor a tail-end LED light-emitting element) is configured to: when this LED light-emitting element works normally, retain control signals of the middle LED light-emitting element from the control signal transmitted from the previous LED light-emitting element, control the display condition of the middle LED light-emitting element by using the control signals, and transmit remaining control signals to a next LED light-emitting element; and the tail-end LED light-emitting element is configured to: when this LED light-emitting element works normally, retain control signals of the tail-end LED light-emitting element from the control signal transmitted from a previous LED light-emitting element, and control the display condition of the tail-end LED light-emitting element by using the control signals.

In this embodiment, the next one of the LED light-emitting elements refers to: among the LED light-emitting elements connected in series with the LED light-emitting element, in the arrangement order from the head-end LED light-emitting element to the tail-end LED light-emitting element, the adjacent LED light-emitting element located after (downstream of) this LED light-emitting element. The previous one of the LED light-emitting element refers to: among the LED light-emitting elements connected in series with the LED light-emitting element, in the arrangement order from the head-end LED light-emitting element to the tail-end LED light-emitting element, the adjacent LED light-emitting element located before (upstream of) this LED light-emitting element.

For example, as shown in FIG. 2, the LED light string where the repeater device $C_1$ is located is taken as an example for illustration, and the control signals retained by the repeater device $C_1$ include: X($D\mathbf{1}_1$); X($D\mathbf{1}_2$); and X($D\mathbf{1}_3$). The repeater device $C_1$ transmits the retained control signals X($D\mathbf{1}_1$), X($D\mathbf{1}_2$) and X($D\mathbf{1}_3$) to the LED light-emitting element $D\mathbf{1}_1$ through the auxiliary signal line by the return-to-zero code protocol, the LED light-emitting element $D\mathbf{1}_1$ retains its own control signal X($D\mathbf{1}_1$) and performs display control on the LED light-emitting element $D\mathbf{1}_1$ by using the control signal X($D\mathbf{1}_1$), and forwards remaining control signals X($D\mathbf{1}_2$) and X($D\mathbf{1}_3$) to the LED light-emitting element $D\mathbf{1}_2$ through the auxiliary signal line by the return-to-zero code protocol. The LED light-emitting element $D\mathbf{1}_2$ retains its own control signal X($D\mathbf{1}_2$), and performs display control on the LED light-emitting element $D\mathbf{1}_2$ by using the control signal X($D\mathbf{1}_2$), and forwards remaining control signal X($D\mathbf{1}_3$) to the LED light-emitting element $D\mathbf{1}_3$ through the auxiliary signal line by the return-to-zero code protocol. The LED light-emitting element $D\mathbf{1}_3$ retains its own control signal X($D\mathbf{1}_3$), and performs display control on the LED light-emitting element $D\mathbf{1}_3$ by using the control signal X($D\mathbf{1}_3$).

Based on a same technical idea, an embodiment of the present disclosure further provides a display method, where the method is applied to a reconfigurable LED display screen, where the reconfigurable LED display screen includes at least one independent LED display unit; the LED display unit includes a control terminal, a main signal line and a plurality of expandable LED light strings, each LED light string includes a repeater device arranged at a head part and LED light-emitting elements sequentially connected in series with the repeater device, and two adjacent LED light-emitting elements in the LED light string are detachably connected in series, so as to change the LED light-emitting elements connected in series in the LED light string; the control terminal and the repeater devices in the plurality of LED light strings are sequentially connected in series to the main signal line, and two adjacent repeater devices on the main signal line are detachably connected in series, so as to change the repeater devices connected in series to the main signal line; the method includes the following steps:

S101: transmitting, by the control terminal, a control signal sequence currently configured for an LED display unit where the control terminal is located to a repeater device connected in series with the control terminal, where the control signal sequence includes control signals of LED light-emitting elements in the LED display unit where the control terminal is located, and an arrangement order of the control signals is determined based on an arrangement order of the repeater devices in the LED display unit and an arrangement order of the LED light-emitting elements in the LED light string;

S102: after the repeater device receives the control signal sequence, retaining first first-LED-count control signals according to first-LED-count configured currently, controlling an LED light string where the repeater device is located by using the retained control signals, and forwarding remaining control signal sequences to a next repeater device, where the first-LED-count configured in the repeater device is a number of LED light-emitting elements connected in series in the LED light string where the repeater device is located.

Optionally, a first expansion input interface and a first expansion output interface are arranged on each LED light-emitting element;

two adjacent LED light-emitting elements in the LED light string are electrically connected or separated through a first expansion input interface on one LED light-emitting element and a first expansion output interface on the other LED light-emitting element, so as to change the LED light-emitting elements connected in series in the LED light string; and a first expansion output interface is retained on an LED light-emitting element at a tail part of the LED light string, and the first expansion output interface is configured to expand and connect first expansion input interfaces of other LED light-emitting elements in series at the tail part of the LED light string.

Optionally, the LED display unit further includes a plurality of branch signal lines, and each repeater device on the main signal line is detachably connected to different branch signal lines; repeater devices in some LED light strings in the LED display screen are connected in series to the main signal line, and for remaining LED light strings, a repeater device in at least one of the remaining LED light strings is connected in series to each branch signal line; and two adjacent repeater devices on the branch signal line are detachably connected in series, so as to change the repeater devices connected in series to the branch signal line.

Optionally, a second expansion input interface and a second expansion output interface are arranged on each repeater device;

two adjacent repeater devices on the main signal line and/or the branch signal line are electrically connected or separated through a second expansion input interface on one repeater device and a second expansion output interface on the other repeater device, so as to change the repeater devices connected in series to the main signal line and/or the branch signal line; and a second expansion output interface is retained on a repeater device located at a tail part on the main signal line and/or the branch signal line, and the second expansion output interface is configured to expand and connect second expansion input interfaces of other repeater devices in series on the repeater device located at the tail part on the main signal line and/or the branch signal line.

Optionally, the control signal is a color control signal, and the color control signal is a signal with a first bit number; the control signal sequence is transmitted through a return-to-zero code protocol, and a signal transmission rate of the return-to-zero code protocol is a first rate;

a number of the LED light-emitting elements connected in series in each LED light string is not more than a first number, so that a refresh rate of the reconfigurable LED display screen reaches a target frame number refreshed by an image per second; and the first number is a ratio of a first data amount to be transmitted per frame to the first bit number, and the first data amount is a ratio of the first rate to the target frame number.

Optionally, a read-write memory is arranged in the repeater device, and the first-LED-count configured in the repeater device is written into the read-write memory.

The repeater device, after receiving the control signal sequence, retains the first first-LED-count control signals according to the first-LED-count configured currently, and includes:

read the written first-LED-count from the read-write memory, and retain the first first-LED-count control signals in the received control signal sequence according to the read first-LED-count.

Optionally, before use, the reconfigurable LED display screen is subjected to initialization configuration on first-LED-count of individual repeater devices in the reconfigurable LED display screen by the following manners:

for each repeater device in the reconfigurable LED display screen, receiving, from the control terminal in the LED display unit where the repeater device is located, a first repeater configuration parameter initialized and configured for the repeater device through a serial port protocol, where the first repeater configuration parameter includes an initialized first-LED-count; and writing the first-LED-count included in the first repeater configuration parameter into a read-write memory of the repeater device, so as to perform initialization repeater parameter configuration on the repeater device.

Optionally, in a use process of the reconfigurable LED display screen, for any one of LED display units in the reconfigurable LED display screen, if there is a change in LED light-emitting elements connected in series in at least one LED light string in the LED display unit, first-LED-count in individual repeater devices in the LED display unit is configured online by the following manners:

for each repeater device in the LED display unit, receiving, from the control terminal in the LED display unit, a first repeater configuration parameter reconfigured for the repeater device through a serial port protocol, where the reconfigured first repeater configuration parameter includes first-LED-count reconfigured for the repeater device online; the first-LED-count reconfigured for the repeater device online is equal to a number of LED light-emitting elements connected in series currently in an LED light string where the repeater device is located; and writing the first-LED-count included in the first repeater configuration parameter into a read-write memory of the repeater device, and replacing the first-LED-count stored in the read-write memory with the first-LED-count reconfigured online, so as to update the first-LED-count in the repeater device online.

Optionally, the first repeater configuration parameter includes, in a sequential order: a first start delimiter, a first command code, a first-LED-count, a first check code and a first end delimiter;

the first check code is obtained by performing an XOR operation on one or more pieces of data in the first start delimiter, the first command code, the first-LED-count and the first end delimiter by the control terminal;

the writing the first-LED-count included in the first repeater configuration parameter into a read-write memory of the repeater device includes:

after receiving a first repeater configuration parameter for the repeater device sent by the control terminal, performing an XOR operation on one or more pieces of data in a first start delimiter, a first command code, a first-LED-count and a first end delimiter included in the received first repeater configuration parameter to obtain a first XOR value;

determining whether the first XOR value is consistent with the first check code, and if the first XOR value is consistent with the first check code, writing the first-LED-count included in the first repeater configuration parameter into the read-write memory of the repeater device; and if the first XOR value is inconsistent with the first check code, stopping writing the first-LED-count included in the first repeater configuration parameter into the read-write memory of the repeater device.

Optionally, if repeater devices in a plurality of LED light strings included in the LED display unit are all connected in series to the main signal line, repeater devices at two ends of the repeater devices connected in series to the main signal line are respectively used as a head-end repeater device and a tail-end repeater device; the head-end repeater device is connected in series with the control terminal;

the repeater device, when configured to, after receiving the control signal sequence, retain first first-LED-count control signals according to first-LED-count configured currently, control an LED light string where the repeater device is located by using the retained control signals, and forward remaining control signal sequences to a next repeater device, is specifically configured to:

when the repeater device is a head-end repeater device, receive a control signal sequence from the control terminal in the LED display unit where the repeater device is located, retain first first-LED-count control signals in the control signal sequence according to first-LED-count configured for the repeater device, control an LED light string where the head-end repeater device is located by using the retained control signals, and forward remaining control signal sequences to a next repeater device of the head-end repeater device; and when the repeater device is a non-head-end repeater device, receive a control signal sequence transmitted from a previous repeater device of the non-head-end repeater device, retain first first-LED-count control signals in the control signal sequence according to first-LED-count configured for the repeater device, control an LED light string where the non-head-end repeater device is located by using the retained control signals, transmit remaining control signal sequences to a next repeater device of the non-head-end repeater device if the non-head-end repeater device is not a tail-end repeater device, or complete transmission of the control signal sequence in the LED display unit where the repeater device is located if the non-head-end repeater device is a tail-end repeater device.

Optionally, repeater devices at two ends of repeater devices connected in series to the branch signal line are respectively used as a branch head-end repeater device and a branch tail-end repeater device, and the branch head-end repeater device is connected to the repeater device on the main signal line; according to the control signal sequence configured for the LED display unit where the control terminal is located in the control terminal, an arrangement order of control signals is determined based on an arrangement order of the repeater devices on the main signal line, an arrangement order of the repeater devices on the branch signal line, and an arrangement order of the LED light-emitting element in the LED light string;

the repeater device, when configured to, after receiving the control signal sequence, retain first first-LED-count control signals according to first-LED-count configured currently, control an LED light string where the repeater device is located by using the retained control signals, and forward remaining control signal sequences to a next repeater device, is specifically configured to:

when the repeater device is a repeater device on the main signal line, after receiving the control signal sequence, retain first second-LED-count control signals according to second-LED-count configured for the repeater device, transmit remaining control signal sequences to a next repeater device of the repeater device on the main signal line through the main signal line, retain first first-LED-count control signals according to first-LED-count configured for the repeater device, control an LED light string where the repeater device is located by using the retained control signals, and transmit remaining control signal sequences to a branch head-end repeater device on the branch signal line through the branch signal line, where the second-LED-count configured in the repeater device on the main signal line is a sum of the first-LED-count and a total number of LED light-emitting elements connected in series in LED light strings on a branch signal line connected to the repeater device; and when the repeater device is a repeater device on the branch signal line, after receiving the control signal sequence, retain first first-LED-count control signals, control the LED light string where the repeater device is located by using the retained control signals, and forward remaining control signal sequences to a next repeater device on the branch signal line through the branch signal line.

Optionally, repeater devices at two ends of repeater devices connected in series to the main signal line are respectively used as a main line head-end repeater device and a main line tail-end repeater device, and the main line head-end repeater device is connected in series with the control terminal;

in a case that the repeater device is a repeater device on the main signal line, the repeater device, when configured to, after receiving the control signal sequence, retain first second-LED-count control signals according to second-LED-count configured for the repeater device, transmit remaining control signal sequences to a next repeater device of the repeater device on the main signal line through the main signal line, retain first first-LED-count control signals according to first-LED-count configured for the repeater device, control an LED light string where the repeater device is located by using the retained control signals, and transmit remaining control signal sequences to a branch head-end repeater device on the branch signal line through the branch signal line, is specifically configured to:

when the repeater device is a main line head-end repeater device, receive a control signal sequence from the control terminal in an LED display unit where the repeater device is located, retain first second-LED-count control signals in the control signal sequence according to the second-LED-count configured for the repeater device, transmit remaining control signal sequences to a next repeater device of the repeater device on the main signal line through the main signal line, retain first first-LED-count control signals from the second-LED-count control signals retained for the repeater device according to the first-LED-count configured for the repeater device, control an LED light string where the repeater device is located by using the retained control signals, transmit remaining control signal sequences in the second-LED-count control signals retained for the repeater device to a branch head-end repeater device on the branch signal line through the branch signal line connected with the repeater device;

when the repeater device is a main line non-head-end repeater device, receive a control signal sequence transmitted from a previous repeater device of the main line non-head-end repeater device on the main signal line, retain first second-LED-count control signals in the control signal sequence according to the second-LED-count configured for the repeater device, transmit remaining control signal sequences to a next repeater device of the main line non-head-end repeater device on the main signal line if the main line non-head-end repeater device is not a main line tail-end repeater device; or complete transmission of the control signal sequence on the main signal line where the repeater device is located if the main line non-head-end repeater device is a main line tail-end repeater device, retain first first-LED-count control signals from second-LED-count control signals retained for the repeater device according to the first-LED-count configured for the repeater device, control an LED light string where the repeater device is located by using the retained control signals, and transmit remaining control signal sequences in the second-LED-count control signals retained for the repeater device to a branch head-end repeater device on the branch signal line through the branch signal line connected with the repeater device.

Optionally, LED light-emitting elements at two ends in the LED light string are respectively a head-end LED light-emitting element and a tail-end LED light-emitting element, and the head-end LED light-emitting element is connected to the repeater device;

the controlling the LED light string where the repeater device is located by using the retained control signal includes:

transmit retained first-LED-count control signals to the head-end LED light-emitting element connected with the repeater device based on the return-to-zero code protocol; and for each LED light-emitting element, when the LED light-emitting element works normally, retaining a control signal for controlling the LED light-emitting element, controlling the LED light-emitting element by the retained control signal, and transmitting remaining control signals to a next LED light-emitting element.

Those skilled in the art may clearly understand that, for the purpose of convenient and brief description, for a detailed working process of the foregoing display method, refer to a corresponding process in the embodiments of the reconfigurable LED display screen. Details are not described herein again.

Finally, it should be noted that the foregoing embodiments are only specific implementations of the present disclosure, which are merely intended to describe the technical solutions of the present disclosure, but are not to limit the present disclosure, and the protection scope of the present disclosure is not limited thereto. Although the present disclosure is described in detail with reference to the foregoing embodiments, those of ordinary skill in the art should understand that those skilled in the art within the technical scope disclosed in the present disclosure may still modify the technical solutions recorded in the foregoing embodiments or easily conceive of changes within the technical scope disclosed in the present disclosure, or make equivalent replacements for some of the technical features therein within the technical scope disclosed in the present disclosure; and these modifications, changes or replacements do not make the essence of the corresponding technical solutions deviate from the spirit and scope of the technical solutions of the embodiments of the present disclosure, and shall fall within the protection scope of the present disclosure. Therefore, the protection scope of the present disclosure shall be subject to the protection scope of the claims.

What is claimed is:

1. A reconfigurable LED display screen, wherein the reconfigurable LED display screen comprises at least one independent LED display unit; the LED display unit comprises a control terminal, a main signal line and a plurality of expandable LED light strings, each LED light string comprises a repeater device arranged at a head part and LED light-emitting elements sequentially connected in series with the repeater device, and two adjacent LED light-emitting elements in the LED light string are detachably connected in series, so as to change the LED light-emitting elements connected in series in the LED light string; the control terminal and the repeater devices in the plurality of LED light strings are sequentially connected in series to the main signal line, and two adjacent repeater devices on the main signal line are detachably connected in series, so as to change the repeater devices connected in series to the main signal line; the control terminal is configured to: transmit a control signal sequence currently configured for an LED display unit where the control terminal is located to a repeater device connected in series with the control terminal; the control signal sequence comprises control signals of LED light-emitting elements in the LED display unit where the control terminal is located, and an arrangement order of the control signals is determined based on an arrangement order of the repeater devices in the LED display unit and an arrangement order of the LED light-emitting elements in the LED light string; the repeater device is configured to: after receiving the control signal sequence, retain first first-LED-count control signals according to first-LED-count configured currently, control an LED light string where the repeater device is located by using the retained control signals, and forward remaining control signal sequences to a next repeater device; and the first-LED-count configured in the repeater device is the number of LED light-emitting elements connected in series in the LED light string where the repeater device is located, wherein the LED display unit further comprises a plurality of branch signal lines, and each repeater device on the main signal line is detachably connected to different branch signal lines; repeater devices in some LED light strings in the LED display screen are connected in series to the main signal line, and for remaining LED light strings, a repeater device in at least one of the remaining LED light strings is connected in series to each branch signal line; and two adjacent repeater devices on the branch signal line are detachably connected in series, so as to change the repeater devices connected in series to the branch signal line.

2. The reconfigurable LED display screen according to claim 1, wherein a first expansion input interface and a first expansion output interface are arranged on each LED light-emitting element;

two adjacent LED light-emitting elements in the LED light string are electrically connected or separated through a first expansion input interface on one LED light-emitting element and a first expansion output interface on the other LED light-emitting element, so as to change the LED light-emitting elements connected in series in the LED light string;

the first expansion output interface is retained on an LED light-emitting element at a tail part of the LED light string, and the first expansion output interface is configured to expand and connect first expansion input interfaces of other LED light-emitting elements in series at the tail part of the LED light string.

3. The reconfigurable LED display screen according to claim 1, wherein a second expansion input interface and a second expansion output interface are arranged on each repeater device;

two adjacent repeater devices on the main signal line and/or the branch signal line are electrically connected or separated through a second expansion input interface on one repeater device and a second expansion output interface on the other repeater device, so as to change the repeater devices connected in series to the main signal line and/or the branch signal line;

a second expansion output interface is retained on a repeater device located at a tail part on the main signal line and/or the branch signal line, and the second expansion output interface is configured to expand and connect second expansion input interfaces of other repeater devices in series on the repeater device located at the tail part on the main signal line and/or the branch signal line.

4. The reconfigurable LED display screen according to claim 3, wherein LED light-emitting elements at two ends in the LED light string are respectively a head-end LED light-emitting element and a tail-end LED light-emitting element, and the head-end LED light-emitting element is connected to the repeater device;

the repeater device, when configured to control an LED light string where the repeater device is located by using the retained control signals, is configured to:

transmit retained first-LED-count control signals to the head-end LED light-emitting element connected with the repeater device based on the return-to-zero code protocol;

the LED light-emitting element is configured to: when the LED light-emitting element works normally, retain a control signal for controlling the LED light-emitting element, control the LED light-emitting element by the retained control signal, and transmit remaining control signals to a next LED light-emitting element.

5. The reconfigurable LED display screen according to claim 1, wherein the control signal is a color control signal, and the color control signal is a signal with a first bit number; the control signal sequence is transmitted through a return-to-zero code protocol, and a signal transmission rate of the return-to-zero code protocol is a first rate;

a number of the LED light-emitting elements connected in series in each LED light string is not more than a first number, so that a refresh rate of the reconfigurable LED display screen reaches a target frame number refreshed by an image per second; and the first number is a ratio of a first data amount to be transmitted per frame to the first bit number, and the first data amount is a ratio of the first rate to the target frame number.

6. The reconfigurable LED display screen according to claim 1, wherein a read-write memory is arranged in the repeater device, and the first-LED-count configured in the repeater device is written into the read-write memory;

the repeater device, when configured to retain the first first-LED-count control signals according to the first-LED-count configured currently, is configured to:

read the written first-LED-count from the read-write memory, and retain the first first-LED-count control signals in the received control signal sequence according to the read first-LED-count.

7. The reconfigurable LED display screen according to claim 6, wherein the reconfigurable LED display screen, before use, is subjected to initialization configuration on first-LED-count of individual repeater devices in the reconfigurable LED display screen by following manners:

for each repeater device in the reconfigurable LED display screen, receiving, from the control terminal in the LED display unit where the repeater device is located, a first repeater configuration parameter initialized and configured for the repeater device through a serial port protocol, wherein the first repeater configuration parameter comprises an initialized first-LED-count; and writing the first-LED-count comprised in the first repeater configuration parameter into the read-write memory of the repeater device, so as to perform initialization repeater parameter configuration on the repeater device.

8. The reconfigurable LED display screen according to claim 7, wherein the first repeater configuration parameter comprises, in a sequential order: a first start delimiter, a first command code, a first-LED-count, a first check code and a first end delimiter; the first check code is obtained by performing an XOR operation on one or more pieces of data in the first start delimiter, the first command code, the first-LED-count and the first end delimiter by the control terminal;

the writing the first-LED-count comprised in the first repeater configuration parameter into a read-write memory of the repeater device comprises:

after receiving the first repeater configuration parameter for the repeater device sent by the control terminal, performing an XOR operation on one or more pieces of data in a first start delimiter, a first command code, a first-LED-count and a first end delimiter comprised in the received first repeater configuration parameter to obtain a first XOR value;

determining whether the first XOR value is consistent with the first check code, and when the first XOR value is consistent with the first check code, writing the first-LED-count comprised in the first repeater configuration parameter into the read-write memory of the repeater device; and when the first XOR value is inconsistent with the first check code, stopping writing the first-LED-count comprised in the first repeater configuration parameter into the read-write memory of the repeater device.

9. The reconfigurable LED display screen according to claim 6, wherein in a use process of the reconfigurable LED display screen, for any one of LED display units in the reconfigurable LED display screen, when there is a change in LED light-emitting elements connected in series in at least one LED light string in the LED display unit, a first-LED-count in individual repeater devices in the LED display unit is configured online by following manners:

for each repeater device in the LED display unit, receiving, from the control terminal in the LED display unit, a first repeater configuration parameter reconfigured for the repeater device through a serial port protocol, wherein the reconfigured first repeater configuration parameter comprises first-LED-count reconfigured for the repeater device online; the first-LED-count reconfigured for the repeater device online is equal to the number of the LED light-emitting elements connected in series currently in the LED light string where the repeater device is located;

writing the first-LED-count comprised in the first repeater configuration parameter into a read-write memory of the repeater device, and replacing the first-LED-count stored in the read-write memory with the first-LED-count reconfigured online, so as to update the first-LED-count in the repeater device online.

10. The reconfigurable LED display screen according to claim 9, wherein the first repeater configuration parameter comprises, in a sequential order: a first start delimiter, a first command code, a first-LED-count, a first check code and a first end delimiter; the first check code is obtained by performing an XOR operation on one or more pieces of data in the first start delimiter, the first command code, the first-LED-count and the first end delimiter by the control terminal;

the writing the first-LED-count comprised in the first repeater configuration parameter into a read-write memory of the repeater device comprises:

after receiving the first repeater configuration parameter for the repeater device sent by the control terminal, performing an XOR operation on one or more pieces of data in a first start delimiter, a first command code, a first-LED-count and a first end delimiter comprised in the received first repeater configuration parameter to obtain a first XOR value;

determining whether the first XOR value is consistent with the first check code, and when the first XOR value is consistent with the first check code, writing the first-LED-count comprised in the first repeater configuration parameter into the read-write memory of the repeater device; and when the first XOR value is inconsistent with the first check code, stopping writing the first-LED-count comprised in the first repeater configuration parameter into the read-write memory of the repeater device.

11. The reconfigurable LED display screen according to claim 1, wherein when the repeater devices in the plurality of LED light strings comprised in the LED display unit are all connected in series to the main signal line, repeater devices at two ends of the repeater devices connected in series to the main signal line are respectively used as a head-end repeater device and a tail-end repeater device; the head-end repeater device is connected in series with the control terminal;

the repeater device, when configured to, after receiving the control signal sequence, retain first first-LED-count control signals according to first-LED-count configured currently, control an LED light string where the repeater device is located by using the retained control signals, and forward remaining control signal sequences to a next repeater device, is configured to:

when the repeater device is the head-end repeater device, receive a control signal sequence from the control terminal in the LED display unit where the repeater device is located, retain first first-LED-count control signals in the control signal sequence according to first-LED-count configured for the repeater device, control an LED light string where the head-end repeater device is located by using the retained control signals, and forward remaining control signal sequences to a next repeater device of the head-end repeater device; and when the repeater device is a non-head-end repeater device, receive a control signal sequence transmitted from a previous repeater device of the non-head-end repeater device, retain first first-LED-count control signals in the control signal sequence according to first-LED-count configured for the repeater device, control an LED light string where the non-head-end repeater device is located by using the retained control signals, transmit remaining control signal sequences to a next repeater device of the non-head-end repeater device when the non-head-end repeater device is not a tail-end repeater device, or complete transmission of the control signal sequence in the LED display unit where the repeater device is located when the non-head-end repeater device is a tail-end repeater device.

12. The reconfigurable LED display screen according to claim 1, wherein the repeater devices at two ends of the repeater devices connected in series to the branch signal line are respectively used as a branch head-end repeater device and a branch tail-end repeater device, and the branch head-end repeater device is connected to the repeater device on the main signal line; according to the control signal sequence configured for the LED display unit where the control terminal is located in the control terminal, an arrangement order of control signals is determined based on an arrangement order of the repeater devices on the main signal line, an arrangement order of the repeater devices on each branch signal line, and an arrangement order of the LED light-emitting elements in the LED light string;

the repeater device, when configured to, after receiving the control signal sequence, retain first first-LED-count control signals according to first-LED-count configured currently, control an LED light string where the repeater device is located by using the retained control signals, and forward remaining control signal sequences to a next repeater device, is configured to:

when the repeater device is a repeater device on the main signal line, after receiving the control signal sequence, retain first second-LED-count control signals according to second-LED-count configured for the repeater device, transmit remaining control signal sequences to a next repeater device of the repeater device on the main signal line through the main signal line, retain first first-LED-count control signals according to first-LED-count configured for the repeater device, control the LED light string where the repeater device is located by using the retained control signals, and transmit remaining control signal sequences to the branch head-end repeater device on the branch signal line through the branch signal line, wherein the second-LED-count configured in the repeater device on the main signal line is a sum of the first-LED-count and a total number of LED light-emitting elements connected in series in LED light strings on a branch signal line connected to the repeater device; and when the repeater device is a repeater device on the branch signal line, after receiving the control signal sequence, retain first first-LED-count control signals, control the LED light string where the repeater device is located by using the retained control signals, and forward remaining control signal sequences to a next repeater device on the branch signal line through the branch signal line.

13. The reconfigurable LED display screen according to claim 12, wherein the repeater devices at two ends of the repeater devices connected in series to the main signal line are respectively used as a main line head-end repeater device and a main line tail-end repeater device, and the main line head-end repeater device is connected in series with the control terminal;

the repeater device on the main signal line, when configured to, after receiving the control signal sequence, retain first second-LED-count control signals according to second-LED-count configured for the repeater device, transmit remaining control signal sequences to a next repeater device of the repeater device on the main signal line through the main signal line, retain first first-LED-count control signals according to first-LED-count configured for the repeater device, control an LED light string where the repeater device is located by using the retained control signals, and transmit remaining control signal sequences to a branch head-end repeater device on the branch signal line through the branch signal line, is configured to:

when the repeater device is a main line head-end repeater device, receive a control signal sequence from the control terminal in an LED display unit where the repeater device is located, retain first second-LED-count control signals in the control signal sequence according to the second-LED-count configured for the repeater device, transmit remaining control signal sequences to a next repeater device of the repeater device on the main signal line through the main signal line, retain first first-LED-count control signals from the second-LED-count control signals retained for the repeater device according to the first-LED-count configured for the repeater device, control an LED light string where the repeater device is located by using the retained control signals, transmit remaining control signal sequences in the second-LED-count control signals retained for the repeater device to a branch head-end repeater device on the branch signal line through the branch signal line connected with the repeater device;

when the repeater device is a main line non-head-end repeater device, receive a control signal sequence transmitted from a previous repeater device of the main line non-head-end repeater device on the main signal line, retain first second-LED-count control signals in the control signal sequence according to the second-LED-count configured for the repeater device, transmit remaining control signal sequences to a next repeater device of the main line non-head-end repeater device on the main signal line when the main line non-head-end repeater device is not a main line tail-end repeater device; or complete transmission of the control signal sequence on the main signal line where the repeater device is located when the main line non-head-end repeater device is a main line tail-end repeater device, retain first first-LED-count control signals from second-LED-count control signals retained for the repeater device according to the first-LED-count configured for the repeater device, control an LED light string where the repeater device is located by using the retained control signals, and transmit remaining control signal sequences in the second-LED-count control signals retained for the repeater device to a branch head-end repeater device on the branch signal line through the branch signal line connected with the repeater device.

14. A display method, wherein the display method is applied to a reconfigurable LED display screen, the reconfigurable LED display screen comprises at least one independent LED display unit; the LED display unit comprises a control terminal, a main signal line and a plurality of expandable LED light strings, each LED light string comprises a repeater device arranged at a head part and LED light-emitting elements sequentially connected in series with the repeater device, and two adjacent LED light-emitting elements in the LED light string are detachably connected in series, so as to change the LED light-emitting elements connected in series in the LED light string; the control terminal and the repeater devices in the plurality of LED light strings are sequentially connected in series to the main signal line, and two adjacent repeater devices on the main signal line are detachably connected in series, so as to change the repeater devices connected in series to the main signal line; and the display method comprises: transmitting, by the control terminal, a control signal sequence currently configured for an LED display unit where the control terminal is located to a repeater device connected in series with the control terminal, wherein the control signal sequence comprises control signals of LED light-emitting elements in the LED display unit where the control terminal is located, and an arrangement order of the control signals is determined based on an arrangement order of the repeater devices in the LED display unit and an arrangement order of the LED light-emitting elements in the LED light string; after the repeater device receives the control signal sequence, retaining first first-LED-count control signals according to first-LED-count configured currently, controlling an LED light string where the repeater device is located by using the retained control signals, and forwarding remaining control signal sequences to a next repeater device, wherein the first-LED-count configured in the repeater device is the number of LED light-emitting elements connected in series in the LED light string where the repeater device is located, wherein the LED display unit further comprises a plurality of branch signal lines, and each repeater device on the main signal line is detachably connected to different branch signal lines; repeater devices in some LED light strings in the LED display screen are connected in series to the main signal line, and for remaining LED light strings, a repeater device in at least one of the remaining LED light strings is connected in series to each branch signal line; and two adjacent repeater devices on the branch signal line are detachably connected in series, so as to change the repeater devices connected in series to the branch signal line.

* * * * *